(12) United States Patent
Nakazawa et al.

(10) Patent No.: US 9,190,453 B2
(45) Date of Patent: Nov. 17, 2015

(54) MAGNETIC MEMORY AND MANUFACTURING METHOD THEREOF

(71) Applicants: Takashi Nakazawa, Seongnam-si (KR); Yoshiaki Asao, Yokkaichi (JP); Takeshi Kajiyama, Seoul (KR); Kenji Noma, Yokohama (JP)

(72) Inventors: Takashi Nakazawa, Seongnam-si (KR); Yoshiaki Asao, Yokkaichi (JP); Takeshi Kajiyama, Seoul (KR); Kenji Noma, Yokohama (JP)

(*) Notice: Subject to any disclaimer, the term of this patent is extended or adjusted under 35 U.S.C. 154(b) by 0 days.

(21) Appl. No.: 14/622,027

(22) Filed: Feb. 13, 2015

(65) Prior Publication Data

US 2015/0155332 A1 Jun. 4, 2015

Related U.S. Application Data

(63) Continuation of application No. 14/018,337, filed on Sep. 4, 2013, now Pat. No. 8,981,446.

(60) Provisional application No. 61/804,388, filed on Mar. 22, 2013.

(51) Int. Cl.
| | | |
|---|---|---|
| H01L 43/00 | (2006.01) | |
| H01L 27/00 | (2006.01) | |
| H01L 27/22 | (2006.01) | |
| H01L 43/12 | (2006.01) | |
| H01L 27/24 | (2006.01) | |
| H01L 43/08 | (2006.01) | |
| H01L 43/02 | (2006.01) | |
| G11C 11/16 | (2006.01) | |

(52) U.S. Cl.
CPC .......... *H01L 27/228* (2013.01); *H01L 27/2463* (2013.01); *H01L 43/02* (2013.01); *H01L 43/08* (2013.10); *H01L 43/12* (2013.01); *G11C 11/161* (2013.01)

(58) Field of Classification Search
CPC ......... H01L 43/02; H01L 43/08; H01L 43/12; H01L 27/228; H01L 27/2463; H01L 27/2436; G11C 11/161; G11C 11/16; G11C 11/404
See application file for complete search history.

(56) References Cited

U.S. PATENT DOCUMENTS

| | | |
|---|---|---|
| 5,879,971 A | 3/1999 | Witek |
| 7,042,758 B2 | 5/2006 | Haneda et al. |
| 8,513,751 B2 | 8/2013 | Asao |
| 8,576,616 B2 | 11/2013 | Saida et al. |
| 8,634,232 B2 | 1/2014 | Oh |
| 8,791,535 B2 | 7/2014 | Asao |

(Continued)

FOREIGN PATENT DOCUMENTS

| | | |
|---|---|---|
| JP | 2012-094880 | 5/2012 |
| JP | 2012-186202 | 9/2012 |
| JP | 2012-204358 | 10/2012 |
| JP | 2013-030552 | 2/2013 |

*Primary Examiner* — Nikolay Yushin
(74) *Attorney, Agent, or Firm* — Holtz, Holtz, Goodman & Chick PC

(57) ABSTRACT

According to one embodiment, a magnetic memory including an isolation region with an insulator in a trench is disclosed. The isolation region defines active areas extending in a 1st direction and having 1st and 2nd active areas, an isolation region extending in a 2nd direction perpendicular to the 1st direction exists between the 1st and 2nd active areas. 1st and 2nd word lines extending in the 2nd direction are buried in a surface of semiconductor substrate. 1st and 2nd select transistors connected to the word lines are on the 1st active area. 1st and 2nd variable resistance elements connected to drain regions of the 1st and 2nd select transistors are on the 1st active area.

17 Claims, 32 Drawing Sheets

(56) References Cited

U.S. PATENT DOCUMENTS

| | | |
|---|---|---|
| 2010/0123114 A1 | 5/2010 | Seko et al. |
| 2010/0238711 A1 | 9/2010 | Asao |
| 2012/0225546 A1 | 9/2012 | Kamiya |
| 2012/0244696 A1 | 9/2012 | Nagashima |
| 2013/0028028 A1 | 1/2013 | Matsunami |
| 2013/0193395 A1 | 8/2013 | Lee |

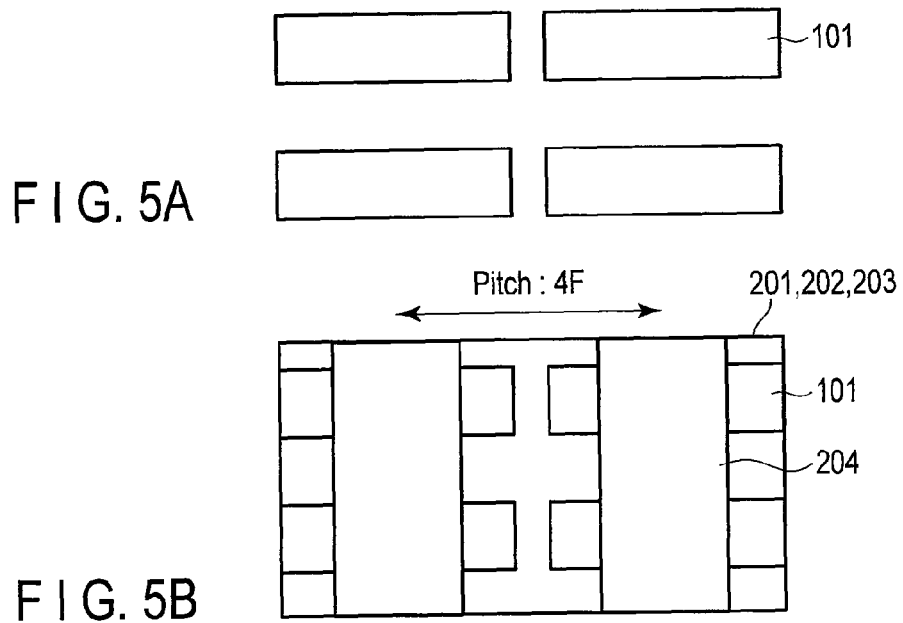
FIG. 5A
FIG. 5B
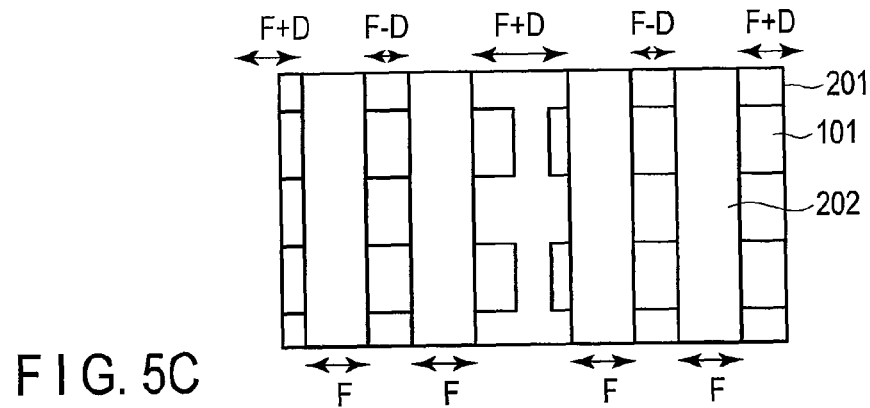
FIG. 5C
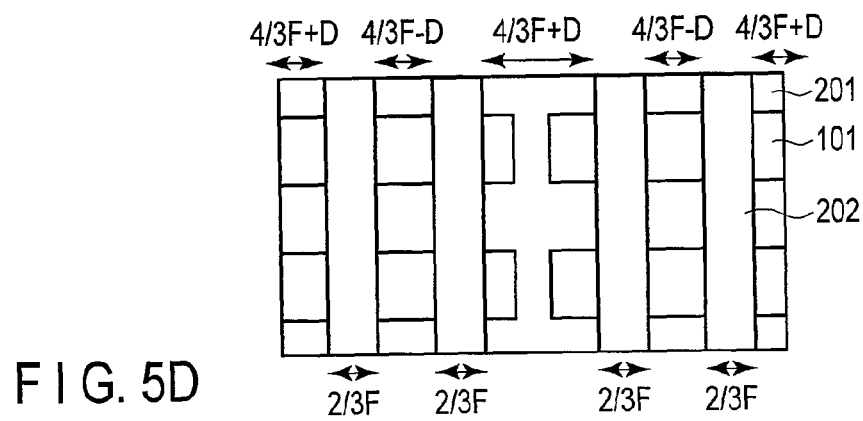
FIG. 5D

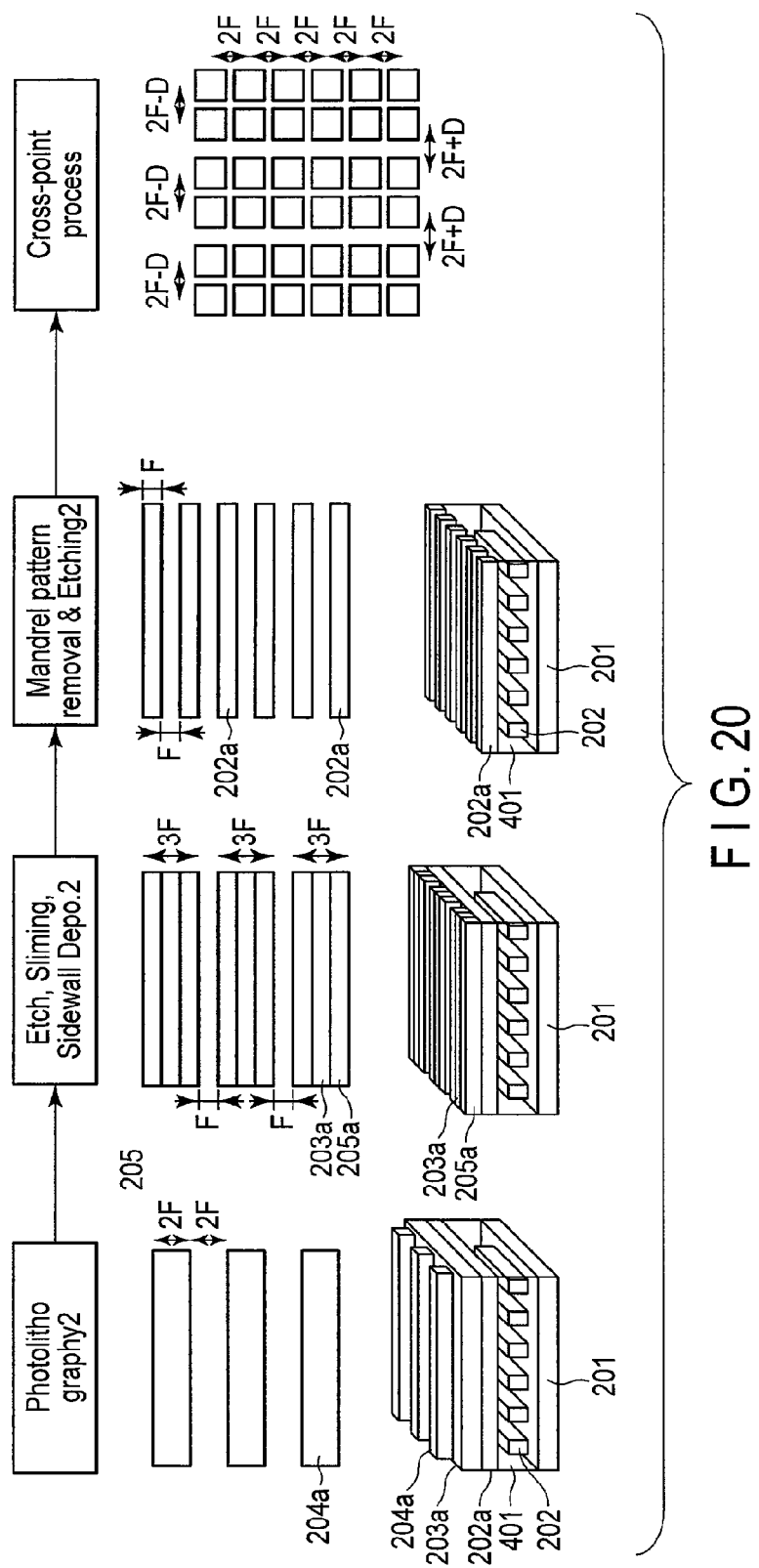
F I G. 20

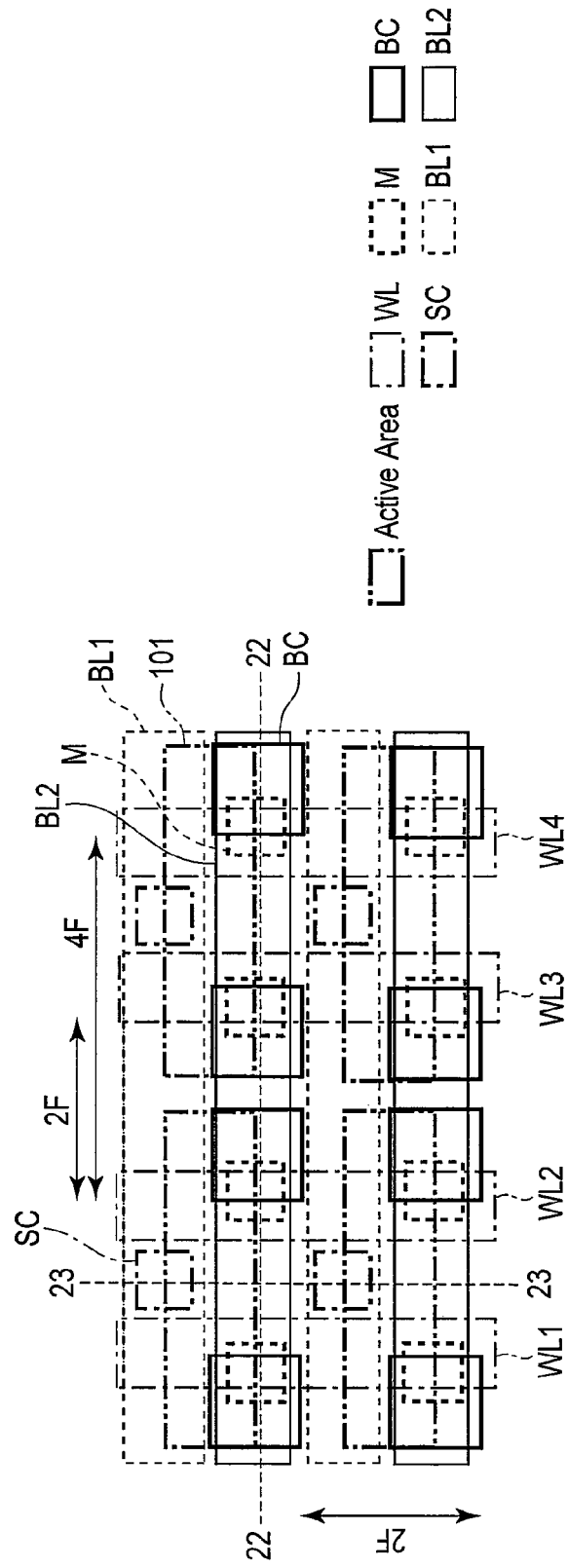
F I G. 21

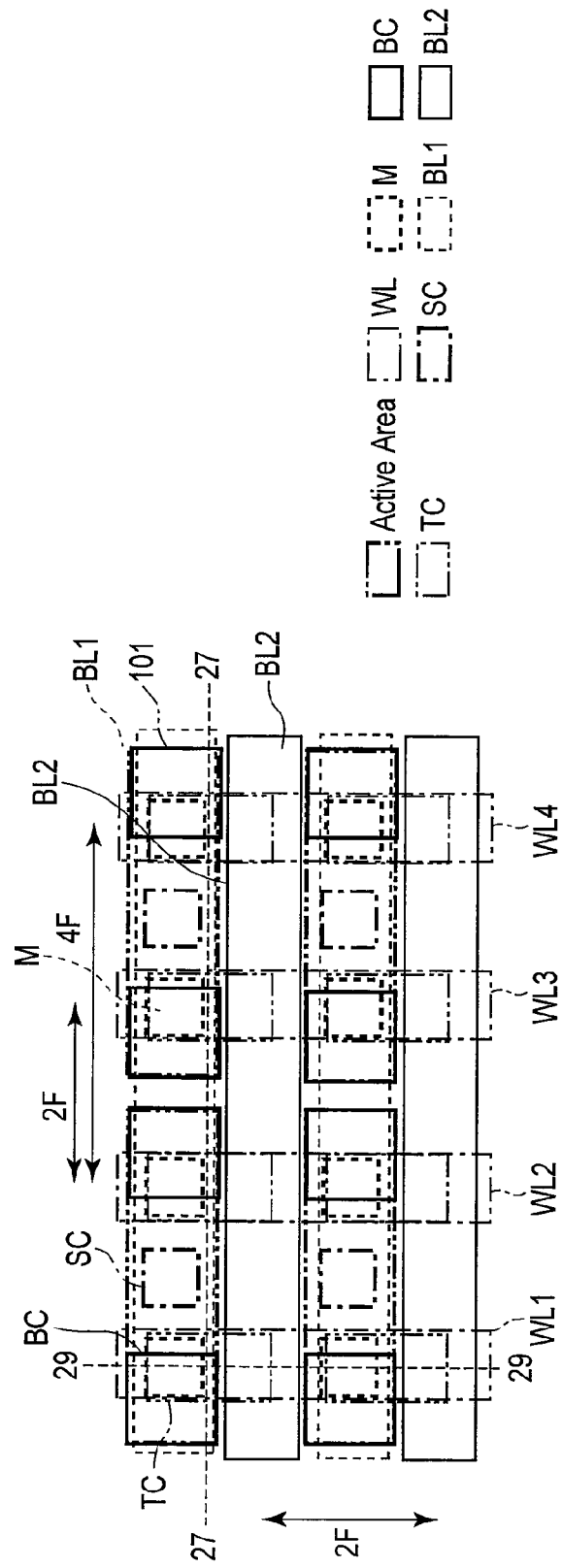
F I G. 27

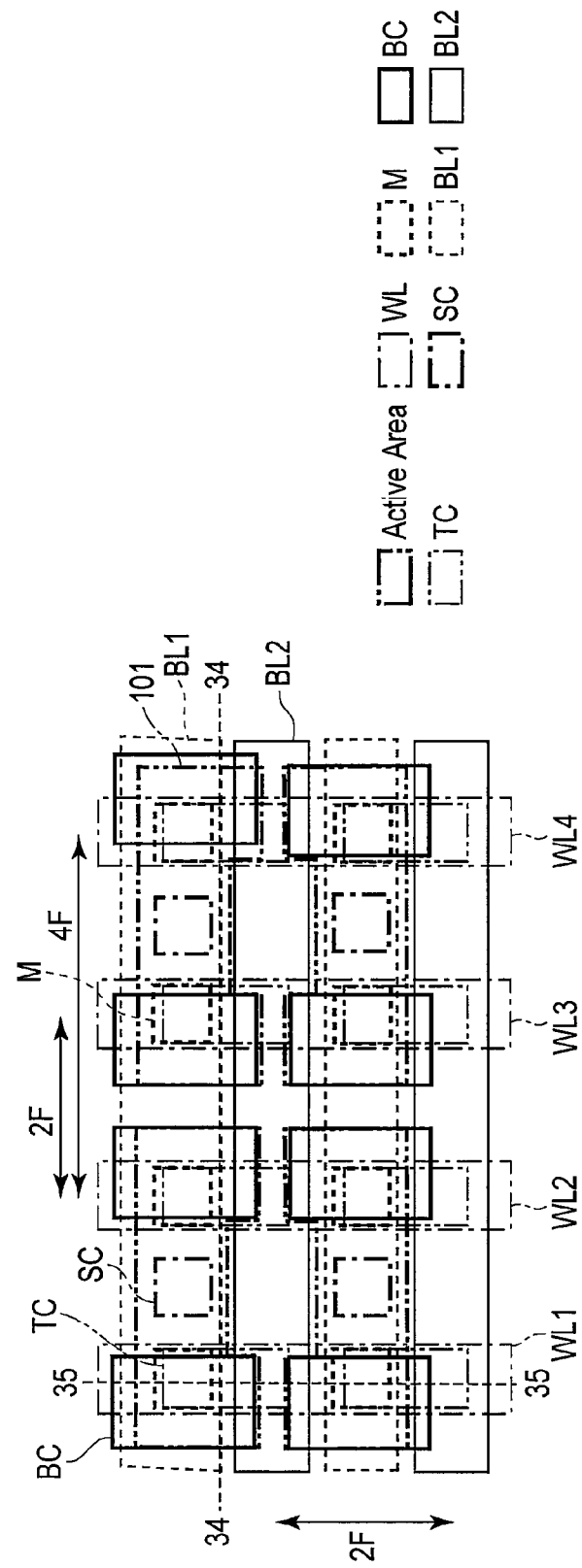
F I G. 33

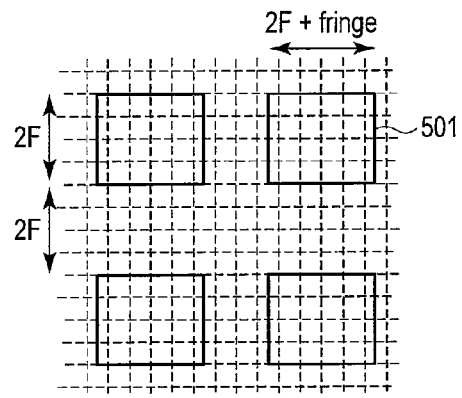
F I G. 38
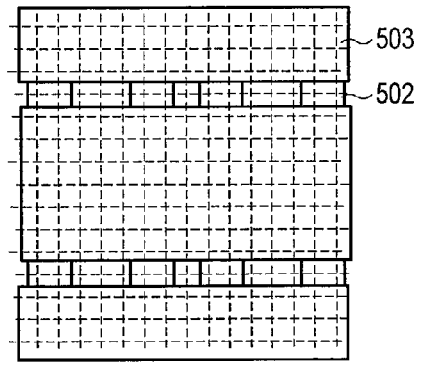
F I G. 41
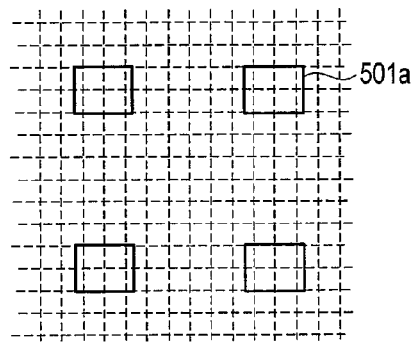
F I G. 39
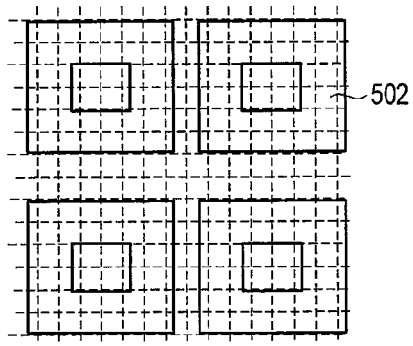
F I G. 40

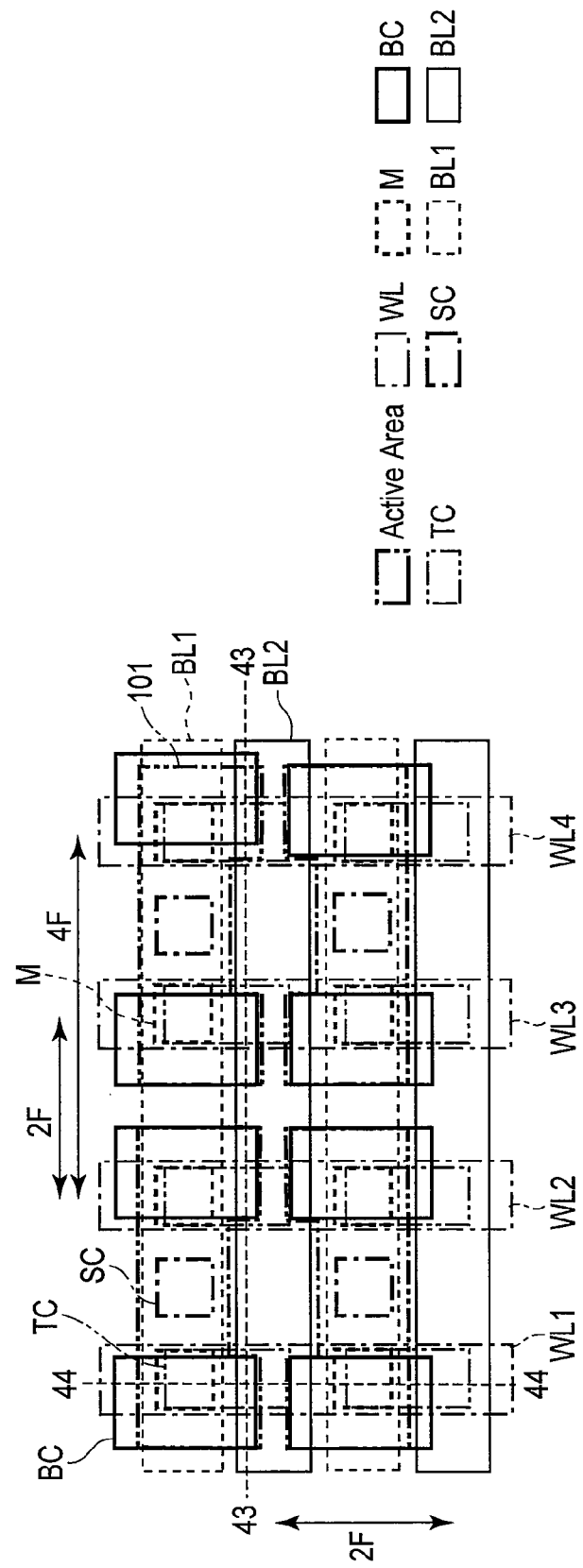
F I G. 42

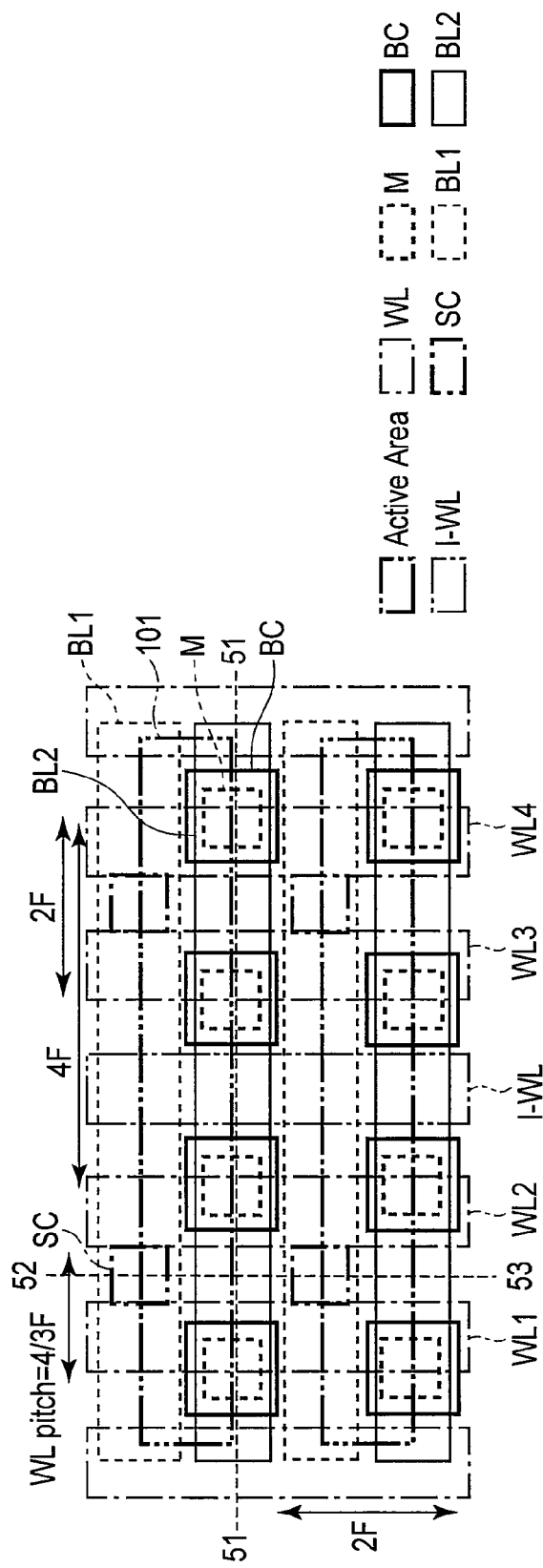
F I G. 50

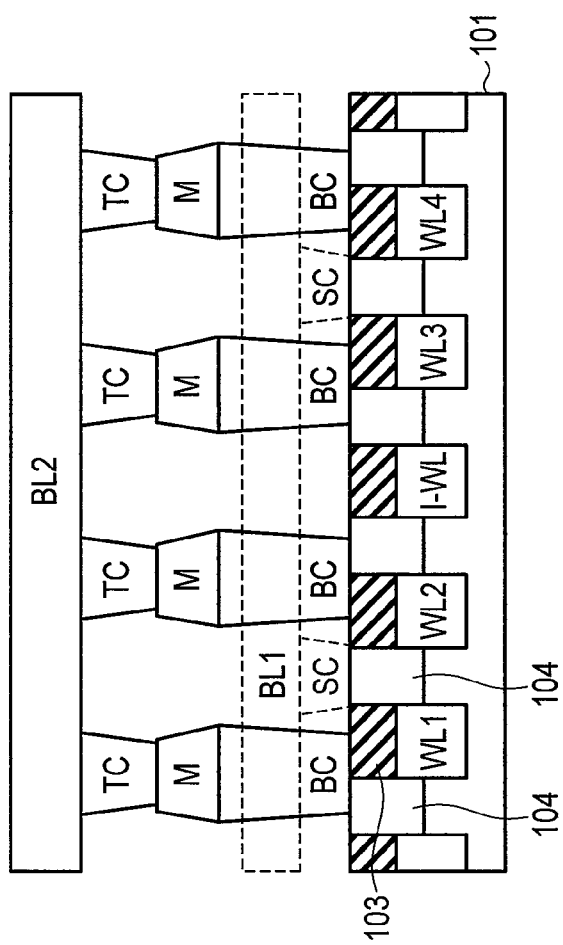
F I G. 51
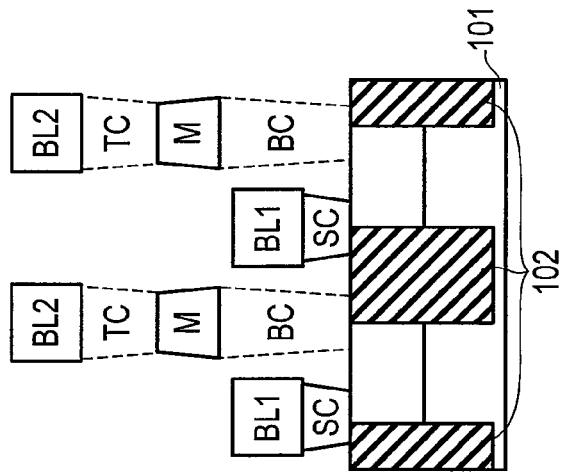
F I G. 52

MAGNETIC MEMORY AND MANUFACTURING METHOD THEREOF

CROSS-REFERENCE TO RELATED APPLICATIONS

This is a Continuation of U.S. Ser. No. 14/018,337, filed Sep. 4, 2013, which claims the benefit of U.S. Provisional Application No. 61/804,388, filed Mar. 22, 2013, the entire contents of which are incorporated herein by reference.

FIELD

Embodiments described herein relate generally to a magnetic memory including a variable resistance element and a manufacturing method thereof.

BACKGROUND

In recent years, a semiconductor memory with a resistance change element such as a PRAM (phase-change random access memory) or an MRAM (magnetic random access memory), has been attracting attention and being developed, in which the resistance change element is utilized as a memory element. The MRAM is a device which performs a memory operation by storing "1" or "0" information in a memory cell by using a magnetoresistive effect, and has such features as nonvolatility, high-speed operation, high integration and high reliability.

A large number of MRAMs, which use elements exhibiting a tunneling magnetoresistive (TMR) effect, among other magnetoresistive effects, have been reported. One of magnetoresistive effect elements is a magnetic tunnel junction (MTJ) element including a three-layer multilayer structure of a recording layer having a variable magnetization direction, an insulating film as a tunnel barrier, and a reference layer which maintains a predetermined magnetization direction.

The resistance of the MTJ element varies depending on the magnetization directions of the recording layer and reference layer. When these magnetization directions are parallel, the resistance takes a minimum value, and when the magnetization directions are antiparallel, the resistance takes a maximum value, and information is stored by associating the parallel state and antiparallel state with binary information "0" and binary information "1", respectively.

Write of information to the MTJ element involves a magnetic-field write scheme in which only the magnetization direction in the recording layer is inverted by a current magnetic field resulting from a current flowing through a write wire and a write (spin injection write) scheme using spin angular momentum movement in which the magnetization direction in the recording layer is inverted by passing a spin polarization current through the MTJ element itself.

In the former scheme, when the element size is reduced, the coercivity of a magnetic body constituting the recording layer increases and the write current tends to increase, and thus it is difficult to achieve both the miniaturization and reduction in electric current.

On the other hand, in the latter scheme (spin injection write scheme), as the volume of the magnetic layer constituting the recording layer becomes smaller, the number of spin-polarized electrons to be injected, may be smaller, and thus it is expected that both the miniaturization and reduction in electric current can be easily achieved.

BRIEF DESCRIPTION OF THE DRAWINGS

FIGS. 5A, 5B, 5C, 5D, 5E, 5F and 5G are plan views for describing a method of forming trenches to be filled with word lines of the magnetoresistive memory according to the first embodiment;

FIG. 20 is a view for describing a method of forming contact holes of the magnetoresistive memory according to the third embodiment;

FIG. 21 is a plan view schematically illustrating a magnetoresistive memory according to a fourth embodiment;

FIG. 27 is a plan view schematically illustrating a magnetoresistive memory according to a sixth embodiment;

FIG. 33 is a plan view schematically illustrating a magnetoresistive memory according to an eighth embodiment;

FIG. 38 is a plan view for describing a method of forming active areas of the magnetoresistive memory according to the eighth embodiment;

FIG. 39 is a plan view for describing the method of forming active areas of the magnetoresistive memory according to the eighth embodiment following FIG. 38;

FIG. 40 is a plan view for describing the method of forming active areas of the magnetoresistive memory according to the eighth embodiment following FIG. 39;

FIG. 41 is a plan view for describing the method of forming active areas of the magnetoresistive memory according to the eighth embodiment following FIG. 40;

FIG. 42 is a plan view schematically illustrating a magnetoresistive memory according to a ninth embodiment;

FIG. 50 is a plan view schematically illustrating a magnetoresistive memory of a comparative example;

FIG. 51 is a cross-sectional view taken along line 51-51 in FIG. 50; and

FIG. 52 is a cross-sectional view taken along line 52-52 in FIG. 50.

DETAILED DESCRIPTION

Figure 1:
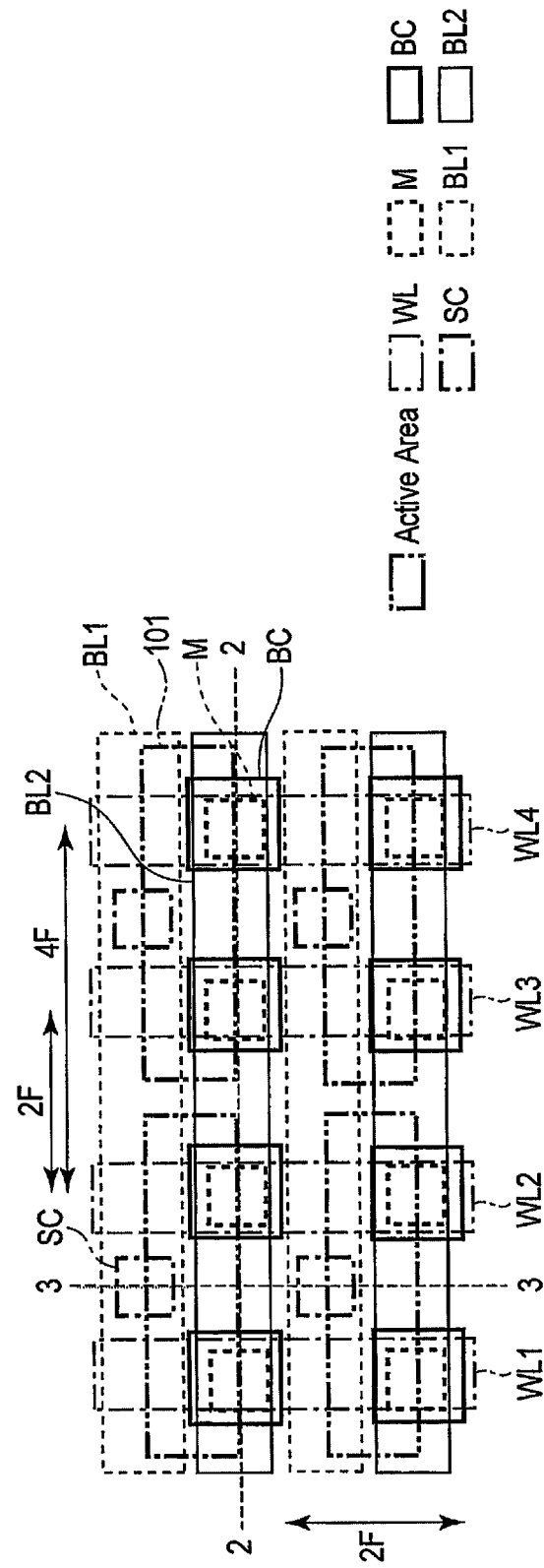
FIG. 1 is a plan view schematically illustrating a magnetoresistive memory according to a first embodiment.

Various embodiments will be described hereinafter with reference to the accompanying drawings. In the drawings to be described below, the parts corresponding to those in a preceding drawing are denoted by like reference numerals (including numerals with different suffixes), and an overlapping description is omitted.

In general, according to one embodiment, a magnetic memory is disclosed. The magnetic memory includes a semiconductor substrate. The magnetic memory further includes an isolation region formed in a surface of the semiconductor substrate. The isolation region includes an insulator filling a trench formed in the surface of the semiconductor substrate. The isolation region defines a plurality of active areas on the surface of the semiconductor substrate. The plurality of active areas include a first active area.

The magnetic memory further includes a first word line which is buried in the surface of the semiconductor substrate including the first active area, and is parallel to a first direction; a second word line which is buried in the surface of the semiconductor substrate including the first active area, with a predetermined distance from the first word line, and is parallel to the first direction; and a first select transistor provided on the first active area, with the first word line being used as a gate electrode thereof.

The magnetic memory further includes a second select transistor provided on the first active area, with the second word line being used as a gate electrode thereof. The first and second select transistors share a source region.

The magnetic memory further includes a first variable resistance element provided on the first active area. The first variable resistance element has one end connected to a drain region of the first select transistor. The magnetic memory further includes a second variable resistance element provided on the first active area. The second variable resistance element has one end connected to a drain region of the second select transistor.

According to an embodiment, a method of manufacturing a magnetic memory is disclosed. The method includes sequentially forming a first layer, a second layer, a third layer and a resist pattern on a semiconductor substrate; etching the third layer by using the resist pattern as a mask; and narrowing a width of a pattern obtained by etching the third layer. The method further includes forming a sidewall on a side wall of the pattern; removing the pattern; etching the second layer by using the sidewall as a mask; and filling a gap of a pattern obtained by etching the second layer with a fourth layer. The method further includes removing the pattern obtained by etching the second layer; etching the first layer by using the fourth layer as a mask; and forming a trench by etching a surface of the semiconductor substrate by using a mask which is a pattern obtained by etching the first layer, the trench being to be filled with a word line of the magnetic memory.

First Embodiment

In the present embodiment, an MRAM is described as an example of a magnetic memory including a variable resistance element. However, the present embodiment is also applicable to other types of magnetic memories including variable resistance elements, such as a PRAM and a ReRAM.

Figure 2:
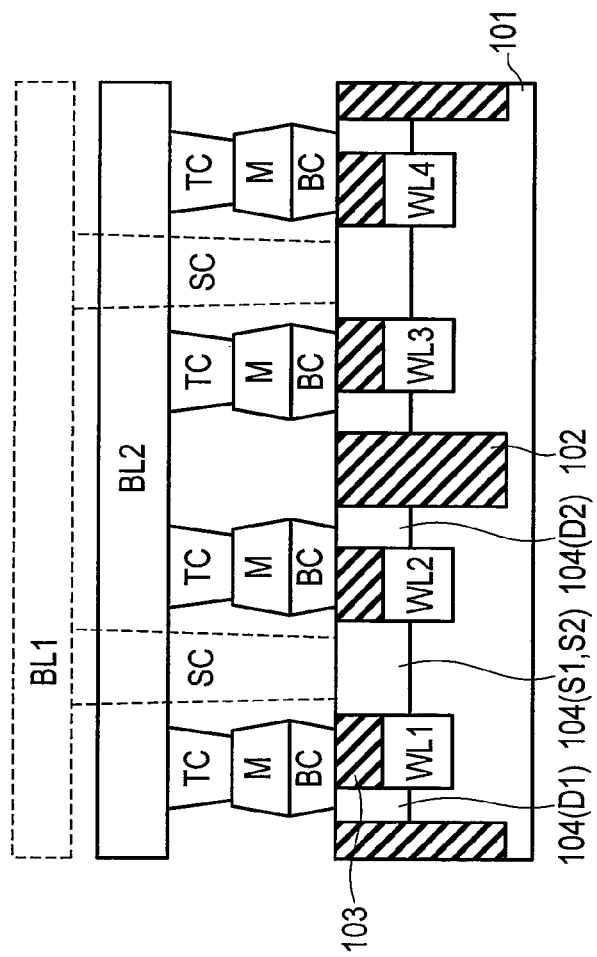
FIG. 2 is a cross-sectional view taken along line 2-2 in FIG. 1.
Figure 3:
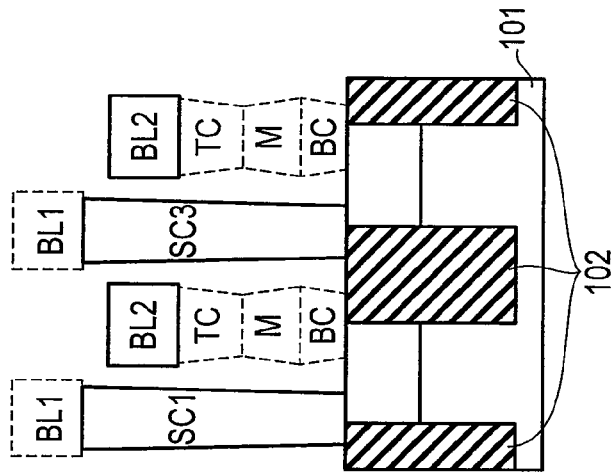
FIG. 3 is a cross-sectional view taken along broken line 3-3 in FIG. 1.

FIG. 1 is a plan view schematically illustrating a magnetoresistive memory according to a first embodiment. FIG. 2 is a cross-sectional view taken along line 2-2 in FIG. 1. FIG. 3 is a cross-sectional view taken along broken line 3-3 in FIG. 1.

In the figures, numeral 101 denotes a silicon substrate (semiconductor substrate). An isolation region 102 is formed in a surface of the silicon substrate 101. The isolation region 102 defines active areas. In the figures, four active areas are shown. The size of each active area is 2F in the vertical direction and 6F in the horizontal direction. F is a feature size.

The MRAM of the present embodiment includes a first select transistor whose gate electrode is a word line WL1, a first MTJ element M which is connected to one source/drain region 104 (drain region D1) of the first select transistor, a second transistor whose gate electrode is a second word line WL2, and a second MTJ element M which is connected to one source/drain region 104 (drain region D2) of the second select transistor.

That is, one memory cell in the present embodiment comprises one MTJ (memory element) and one select transistor, and the two select transistors of the two neighboring memory cells share the other source/drain region 104 (source region S1, S2).

The gate (gate insulating film, gate electrode) of the select transistor in the present embodiment is buried in the surface of the silicon substrate 101. The select transistor of the present embodiment is of a so-called BG (Buried Gate) type.

One source/drain region 104 (D1) of the first select transistor is connected to a lower part of the first MTJ element M via a plug BC. An upper part of the first MTJ element M is connected to a second bit line BL2 via a plug TC.

The other source/drain region 104 (S1) of the first select transistor is connected to a first bit line (source line) BL1 via a plug SC.

One source/drain region 104 (D2) of the second select transistor is connected to a lower part of the second MTJ element M via a plug BC. An upper part of the second MTJ element M is connected to the second bit line BL2 via a plug TC.

The other source/drain region 104 (S2) of the second select transistor is connected to the first bit line BL1 via the plug SC.

The first select transistor, first MTJ element M, second select transistor and second MTJ element M (two memory cells) are provided in each active area. Two neighboring active areas are isolated by the isolation region 102. The isolation region 102 in the present embodiment is an STI (Shallow Trench Isolation) region.

The bit lines BL1 and BL2 are configured to have alternately changed heights. Thereby, the pitch between neighboring BL lines is relaxed to be doubled, and a parasitic capacitance between neighboring bit lines is reduced. In the figures, the bit line BL1 is higher than the bit line BL2. However, conversely, the bit line BL2 may be higher than the bit line BL1.

Word lines WL3 and WL4 correspond to the word lines WL1 and WL2, respectively. Accordingly, two memory cells are constituted by a first select transistor whose gate electrode is the word line WL3, a first MTJ element M which is connected to one source/drain region 104 of the first select transistor, a second transistor whose gate electrode is a second word line WL2, and a second MTJ element M which is connected to one source/drain region 104 of the second select transistor.

A distance (L12) between the word line WL1 and word line WL2 in the present embodiment is $(4/3)F-D$. Here, D is greater than zero and is less than $(2/3)F$ ($0<D<F$). That is, in the case of the present embodiment, the distance (L12) between the word lines provided in the same active area is $(4/3)F-D$.

A distance (L23) between the word line WL2 and word line WL3 in the present embodiment is $(4/3)F+D$. That is, in the case of the present embodiment, the distance between two word lines, which neighbor via the isolation region 102, is $(4/3)F+D$. These two word lines are provided in different active areas, respectively.

FIG. 50 is a plan view schematically illustrating a magnetoresistive memory of a comparative example. FIG. 51 is a cross-sectional view taken along line 51-51 in FIG. 50, and FIG. 52 is a cross-sectional view taken along line 52-52 in FIG. 50. In the figures, I-WL denotes a word line for isolation. The memory cell area of the comparative example is the same as that of the present embodiment.

A distance (L12') between the word line WL1 and word line WL2 in the comparative example is $(2/3)F$. A distance (L23') between the word line WL2 and word line WL3 in the comparative example is 2F. The WL1, WL2, I-WL, WL3 and WL4 are arranged at regular intervals.

If the present embodiment and the comparative example are compared, $L12-L12'=\{(4/3)F-D\}-(2/3)F=(2/3)F-D>0$. That is, the distance between neighboring word lines in the same active area is greater in the present embodiment than in the comparative example. Thus, according to the present embodiment, the parasitic capacitance between word lines can be decreased.

Next, a manufacturing method of the magnetoresistive memory of the present embodiment is described.

Figure 4:
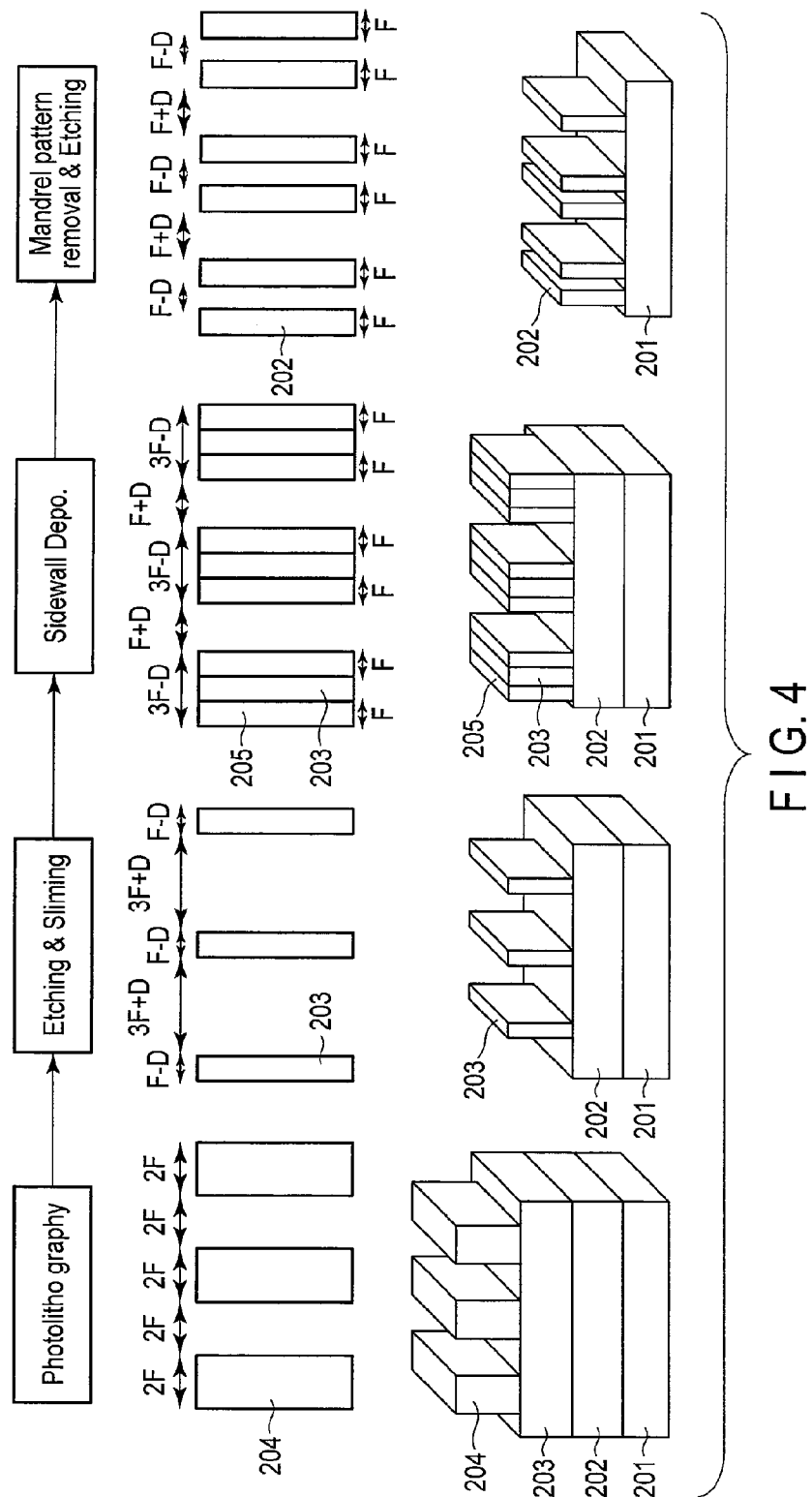
FIG. 4 is a view for explaining an SPT method in an embodiment.

FIG. 4 is a view for explaining a double patterning method which is called a SPT (Sidewall Patterning Technology) method according to the present embodiment.

A first layer 201, a second layer 202 and a third layer 203 are successively formed. Then, using a photolithography process, a resist pattern 204 is formed on the third layer 203. The resist pattern 204 has a shape of a line-and-space pattern (L&S pattern). The L&S pattern has a width of 2F, a space of 2F, and a pitch of 4F. The materials of the first, second and third layers 201 to 203 are different from each other.

Using the resist pattern 204 as a mask, the third layer 203 is etched, and then the width of the third layer 203 is narrowed by D by slimming. Thus, the third layer (core material) 203 having a shape of L&S pattern is obtained. The L&S pattern has a width of $F-D$, a space of $3F+D$, and a pitch of 4F.

Sidewalls 205 are formed on side walls of the third layer 203.

The third layer 203 is removed, and then the second layer 202 is etched by using the sidewalls 205 as a mask. In this manner, the second layer 202 having the shape of L&S pattern is obtained. The L&S pattern has a width of F, a space of $F-D$, and a pitch of 4F.

Thereafter, using the second layer 202 as a mask, the first layer 201 is etched.

FIG. 5A to FIG. 5F are plan views for describing an example in which the above-described SPT method of the present embodiment is applied to the magnetic memory of the present embodiment, more particularly, plan views for describing a method of forming trenches in which word lines are buried.

As shown in FIG. 5A, a semiconductor substrate 101 is processed for a device isolation, and active areas are formed.

Next, as shown in FIG. 5B, first to third layers 201 to 203 and a resist pattern 204 are formed.

Next, as shown in FIG. 5C, according to the SPT method of the present embodiment illustrated in FIG. 4, the second layer 202 is processed so as to have the shape of L&S pattern.

Next, as shown in FIG. 5D, the width of the second layer 202 is reduced from F to $(2/3)F$ by, slimming or the like.

Figure 5E:
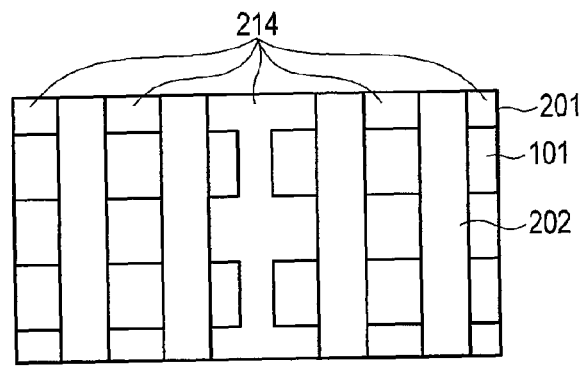

Next, as shown in FIG. 5E, by deposition of a fourth layer 214 and CMP (Chemical Mechanical Polishing), the space of the second layer 202 is filled with the fourth layer 214 and the surface is planarized.

Figure 5F:
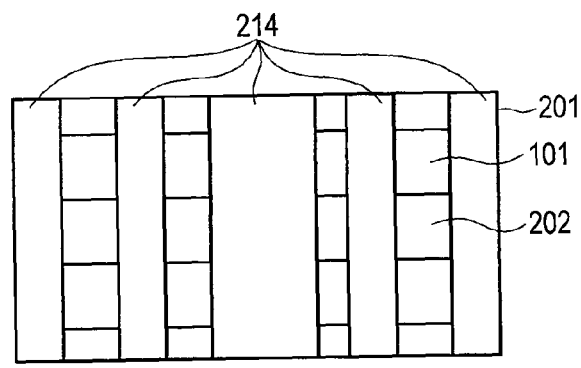

Next, as shown in FIG. 5F, the second layer 202 is removed. As a result, the shape of the fourth layer 214 becomes an L&S pattern having a width of $(2/3)F$, a space of $(4/3)F-D$, and a pitch of 4F.

Figure 5G:
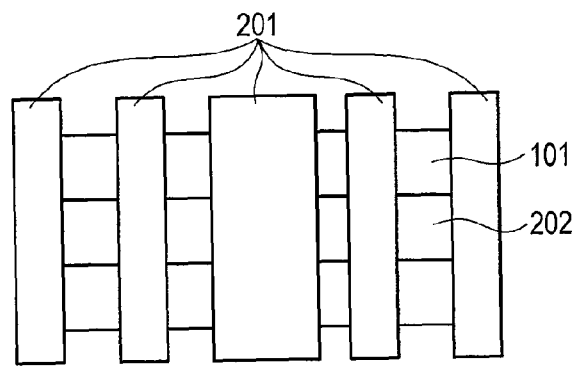

Next, as shown in FIG. 5G, the first layer 201 is etched by using the fourth layer 214 as a mask.

Thereafter, the surface of the silicon substrate (active areas) 101 is etched by using the first layer 201 as a mask to obtain trenches in which word lines are buried.

FIG. 6 to FIG. 13 are cross-sectional views for describing a manufacturing method of the magnetic memory of the present embodiment, with use of the above-described trench forming method.

Figure 6:
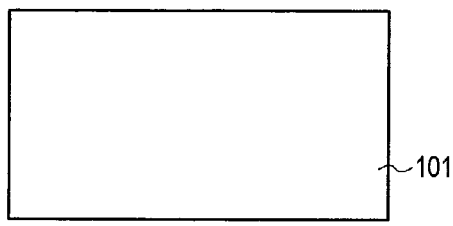
FIG. 6 is a cross-sectional view for describing a method of manufacturing the magnetoresistive memory according to the first embodiment.

FIG. 6 shows a silicon substrate 101 of a region (well) where select transistors are to be formed. The silicon substrate 101 is, for example, of a p-type. In this case, the well is of a high-concentration p-type.

Figure 7:
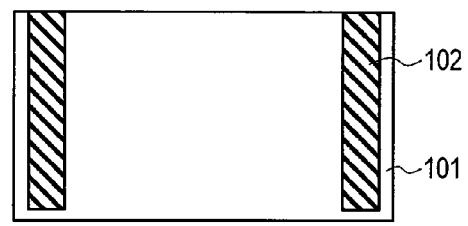
FIG. 7 is a cross-sectional view for describing the method of manufacturing the magnetoresistive memory according to the first embodiment following FIG. 6.
Figure 8:
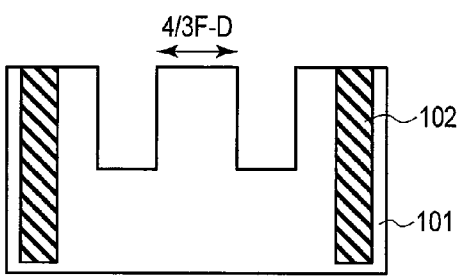
FIG. 8 is a cross-sectional view for describing the method of manufacturing the magnetoresistive memory according to the first embodiment following FIG. 7.

Next, as shown in FIG. 7, an isolation region 102 is formed by STI process, thereafter, as shown in FIG. 8, trenches are formed in the active area by using the above-described trench forming method.

Figure 9:
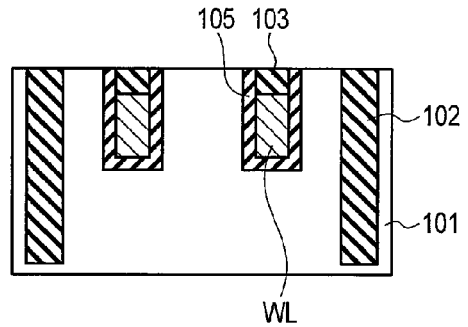
FIG. 9 is a cross-sectional view for describing the method of manufacturing the magnetoresistive memory according to the first embodiment following FIG. 8.

Next, as shown in FIG. 9, a gate insulating film 105 is formed on a bottom surface and a side surface of the trench, thereafter, a word line WL and a cap insulating film 103 are formed in the trench.

Figure 10:
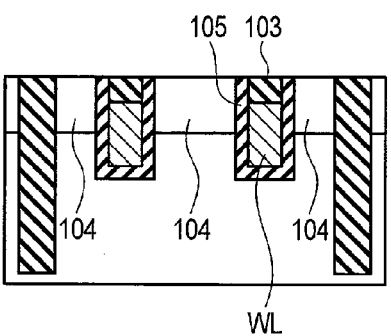
FIG. 10 is a cross-sectional view for describing the method of manufacturing the magnetoresistive memory according to the first embodiment following FIG. 9.

Next, as shown in FIG. 10, source/drain regions 104 are formed in the surface of the active area by ion implantation.

Figure 11:
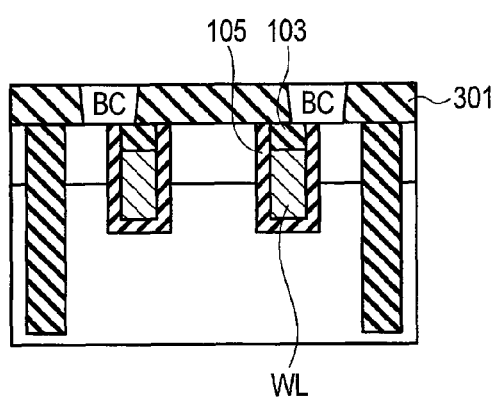
FIG. 11 is a cross-sectional view for describing the method of manufacturing the magnetoresistive memory according to the first embodiment following FIG. 10.

Next, as shown in FIG. 11, an interlayer insulating film 301 is formed, thereafter, contact holes are formed in the interlayer insulating film 301, and plugs BC are formed in the contact holes. The pitch of plugs BC in an X direction (horizontal direction) is 2F.

Figure 12:
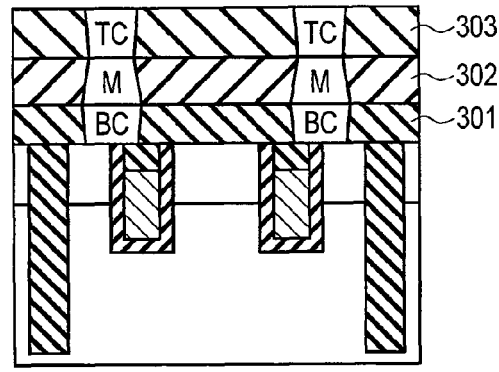
FIG. 12 is a cross-sectional view for describing the method of manufacturing the magnetoresistive memory according to the first embodiment following FIG. 11.

Next, as shown in FIG. 12, an interlayer insulating film 302 is formed on the interlayer insulating film 301, thereafter, contact holes are formed in the interlayer insulating film 302, and MTJ elements M are formed in the contact holes. Alternatively, the MTJ elements M are formed on the interlayer insulating film 301, then an interlayer insulating film 302 is formed such that the MTJ elements M are buried in the interlayer insulating film 302, and a region including the MTJ elements M and the interlayer insulating film 302 is planarized by CMP. Next, an interlayer insulating film 303 is formed on the interlayer insulating film 302, thereafter, contact holes are formed in the interlayer insulating film 303, and plugs TC are formed in the contact holes.

Figure 13:
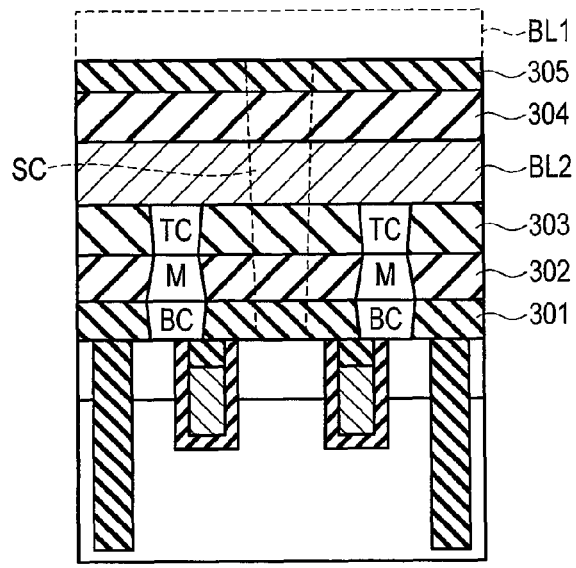
FIG. 13 is a cross-sectional view for describing the method of manufacturing the magnetoresistive memory according to the first embodiment following FIG. 12.

Next, as shown in FIG. 13, a bit line BL2 and interlayer insulating films 304 and 305 are formed on the interlayer insulating film 303. Thereafter, a plug SC (source contact) and a bit line BL1 (source line) are formed, and the device structure illustrated in FIG. 1 to FIG. 3 is obtained.

Second Embodiment

Figure 14:
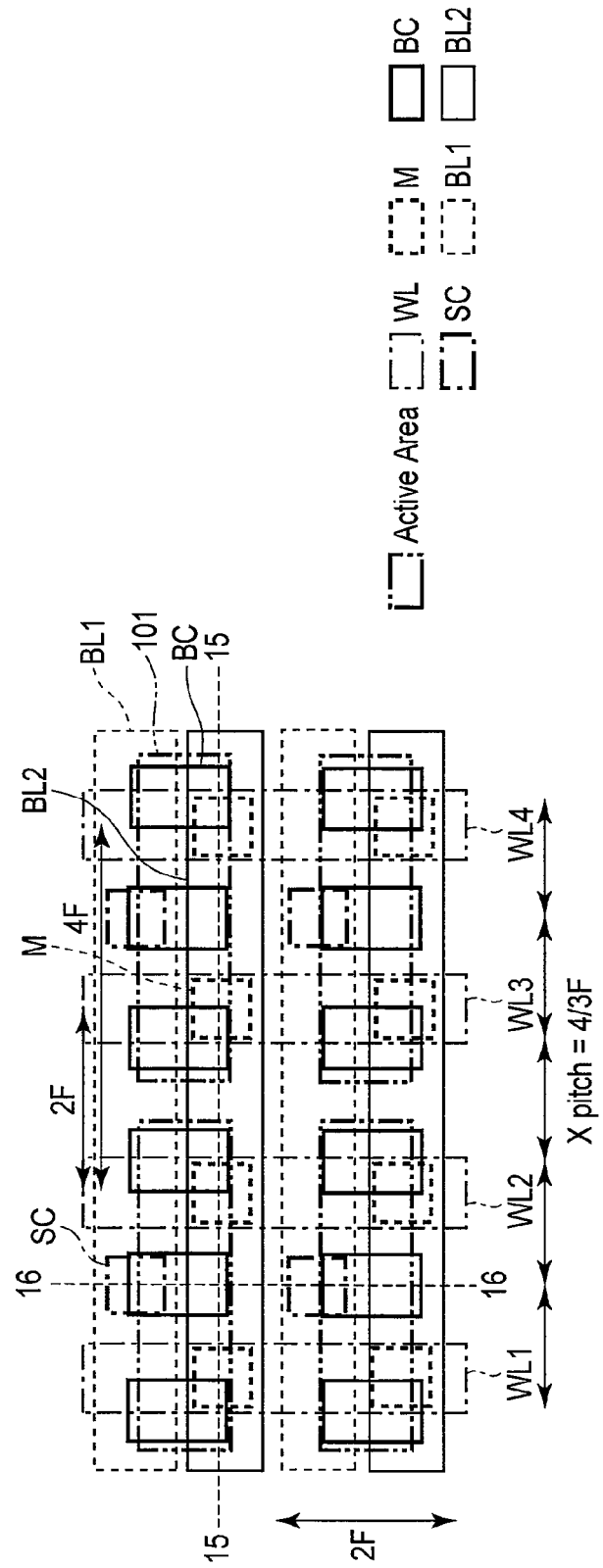
FIG. 14 is a plan view schematically illustrating a magnetoresistive memory according to a second embodiment.
Figure 16:
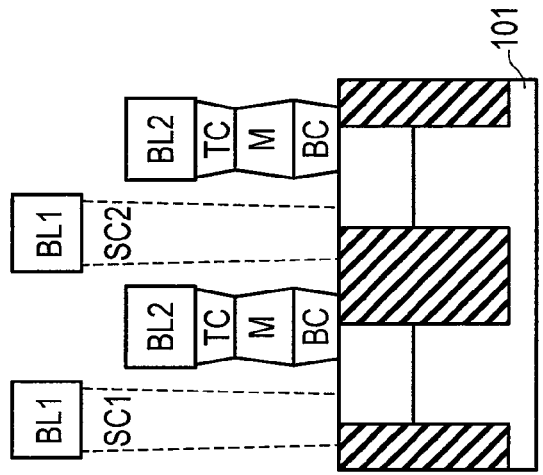
FIG. 16 is a cross-sectional view taken along line 16-16 in FIG. 14.
Figure 15:
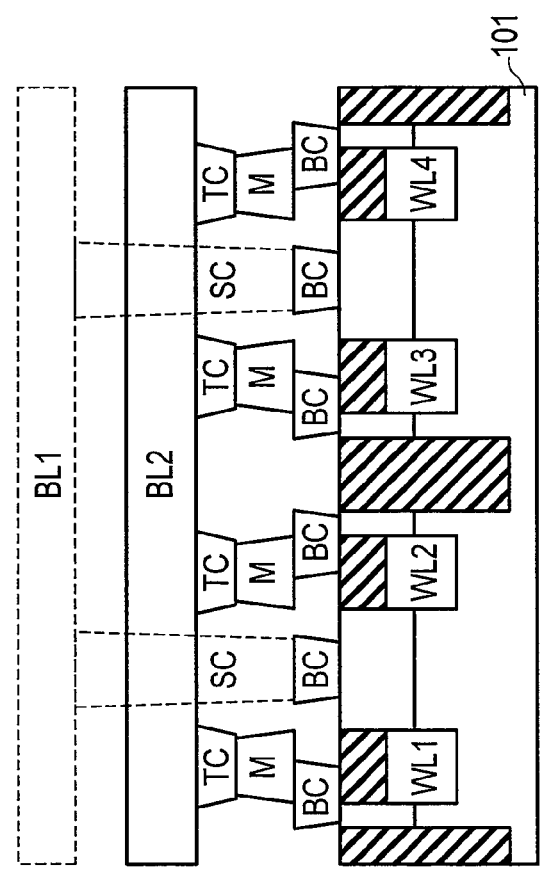
FIG. 15 is a cross-sectional view taken along line 15-15 in FIG. 14.

FIG. 14 is a plan view schematically illustrating a magnetoresistive memory according to a second embodiment. FIG. 15 is a cross-sectional view taken along line 15-15 in FIG. 14, and FIG. 16 is a cross-sectional view taken along line 16-16 in FIG. 14.

In the first embodiment, the pitch of plugs BC in the X direction is 2F, but in the present embodiment, the pitch of plugs BC in the X direction is 4/3F, and a plug BC is also formed under the plug SC. Because of this, in the first embodiment, when the BC width is increased in the Y direction (vertical direction), a risk of contact with the SC may increases, but in the present embodiment, the BC width can be increased without the risk. As a result, the contact area between the plug BC and the source/drain region of the present embodiment becomes larger than that of the first embodiment. Thereby, the parasitic resistance (contact resistance) between the plug BC and the source/drain region can be reduced, without increasing the area of the memory cell.

Third Embodiment

Figure 17:
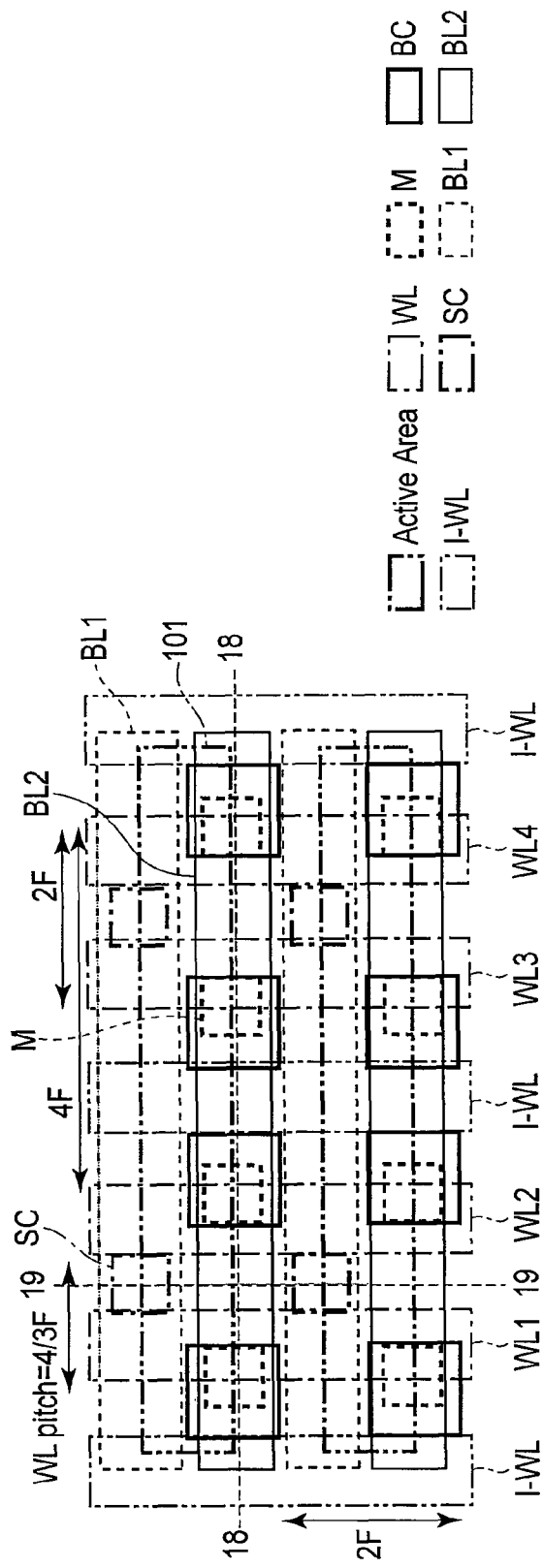
FIG. 17 is a plan view schematically illustrating a magnetoresistive memory according to a third embodiment.
Figure 19:
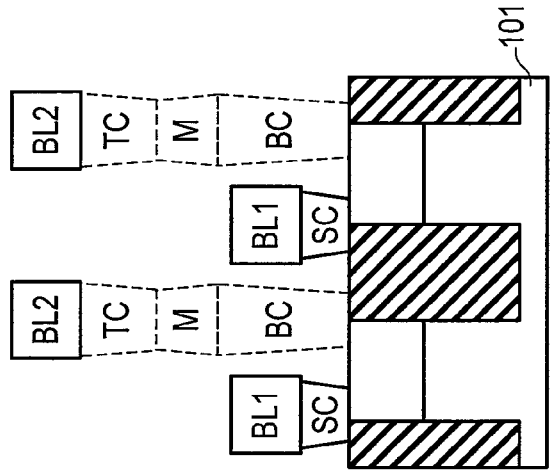
FIG. 19 is a cross-sectional view taken along line 19-19 in FIG. 17.
Figure 18:
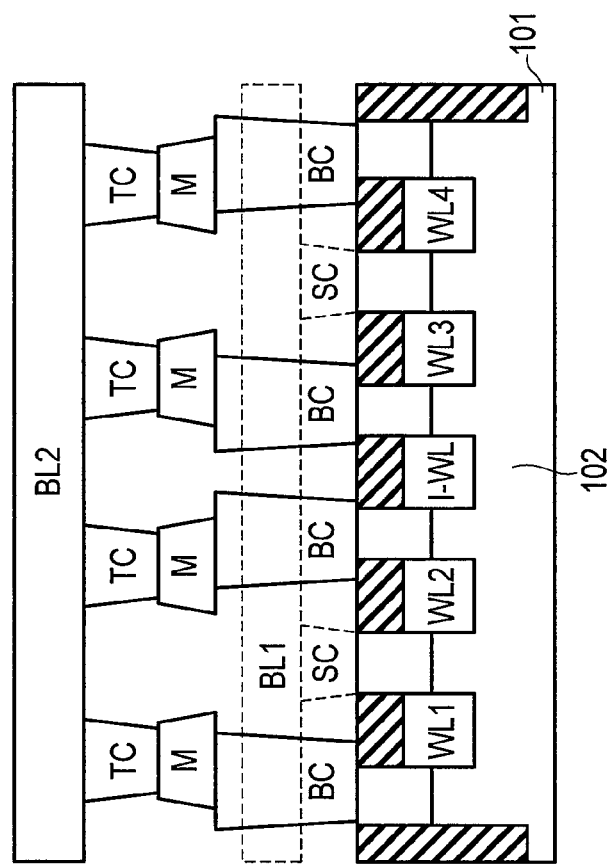
FIG. 18 is a cross-sectional view taken along line 18-18 in FIG. 17.

FIG. 17 is a plan view schematically illustrating a magnetoresistive memory according to a third embodiment. FIG. 18 is a cross-sectional view taken along line 18-18 in FIG. 17, and FIG. 19 is a cross-sectional view taken along line 19-19 in FIG. 17.

The distance in the X direction between two plugs BC on the active area in the present embodiment is larger that of the first embodiment. The two plugs BC on the active area in the present embodiment are shifted in the X direction so that the area of contact with the active source/drain region may increase. Thereby, the parasitic resistance (contact resistance) between the plug BC and source/drain region can be reduced, without increasing the area of the memory cell.

FIG. 20 is a view for describing a method of forming contact holes in which plugs BC of the magnetoresistive memory according to the present embodiment are buried.

A second layer 202 having the shape of L&S pattern is formed on the first layer 201 by the SPT method illustrated in FIG. 4, thereafter, a fifth layer 401 is formed on the entire surface. A sixth layer 202a, a seventh layer 203a and a resist pattern 204a are successively formed on the fifth layer 401. The sixth layer 202a, seventh layer 203a and resist pattern 204a correspond to the second layer 202, third layer 203 and resist pattern 204 shown in FIG. 4, respectively. The L&S pattern of the resist pattern 204a is perpendicular to the L&S pattern of the resist pattern 204.

The seventh layer 203a is etched by using the resist pattern 204a as a mask, thereafter, sidewalls 205a are formed on side walls of the seventh layer 203a.

The seventh layer 203a is removed, thereafter, the sixth layer 202a is etched by using the sidewalls 205a as a mask. In this manner, the sixth layer 202a having the shape of L&S pattern is obtained. The L&S pattern of the sixth layer 202a is perpendicular to the L&S pattern of the second layer 202.

Thereafter, the first layer 201 is etched by using the second layer 202 and sixth layer 202a as a mask (cross-point process).

In the present embodiment, as illustrated in FIG. 20, the mask 201 having the contact pattern with pitches displaced on every other column can be formed, by applying the SPT method of the present embodiment which can adjust the pitch on every other column, to the first-layer L&S pattern 202, when the cross-point process is performed by forming two-layer L&S patterns called LELE (Litho-Etch-Litho-Etch). Contact holes with pitches differing on every other column can be formed by applying this method at the time of forming the plugs BC. As illustrated in FIG. 18, the contact area between the plug BC and source/drain region can be increased.

In the present embodiment, the SPT method of the present embodiment which can adjust the pitch on every other column, is applied to the first-layer L&S pattern 202, but the SPT method of the present embodiment may be applied to the second-layer L&S pattern 202a.

Fourth Embodiment

Figure 23:
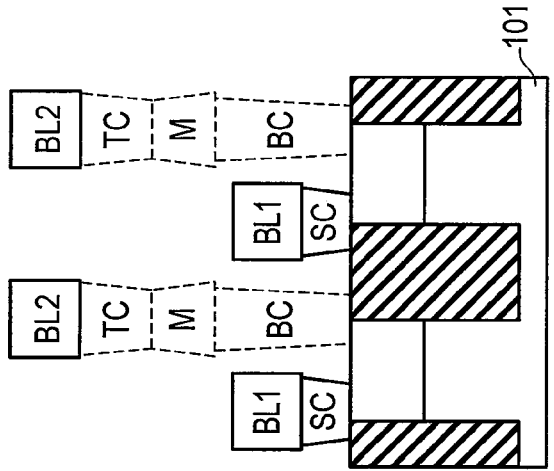
FIG. 23 is a cross-sectional view taken along line 23-23 in FIG. 21.
Figure 22:
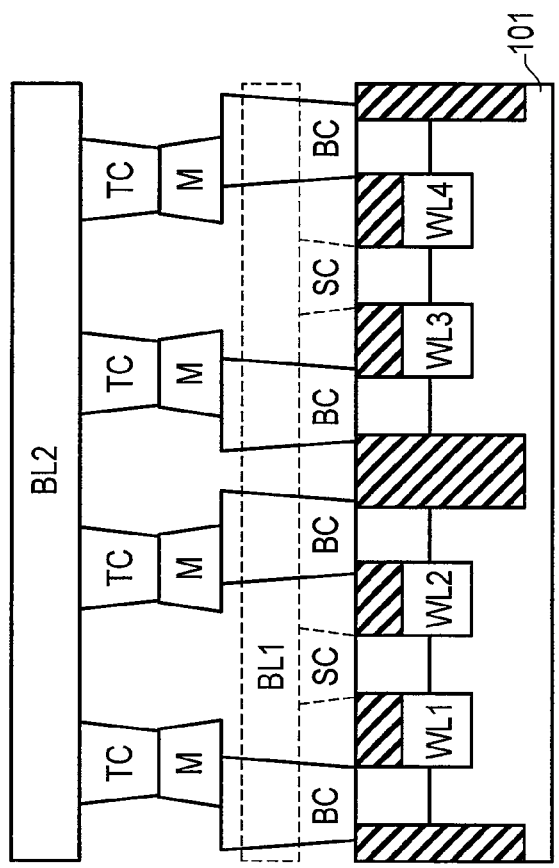
FIG. 22 is a cross-sectional view taken along line 22-22 in FIG. 21.

FIG. 21 is a plan view schematically illustrating a magnetoresistive memory according to a fourth embodiment. FIG. 22 is a cross-sectional view taken along line 22-22 in FIG. 21, and FIG. 23 is a cross-sectional view taken along line 23-23 in FIG. 21.

The present embodiment is an example of combination of the first embodiment and the third embodiment. Therefore, according to the present embodiment, the parasitic capacitance between word lines can be reduced, and the parasitic resistance between the plug BC and source/drain region can be reduced.

Fifth Embodiment

Figure 24:
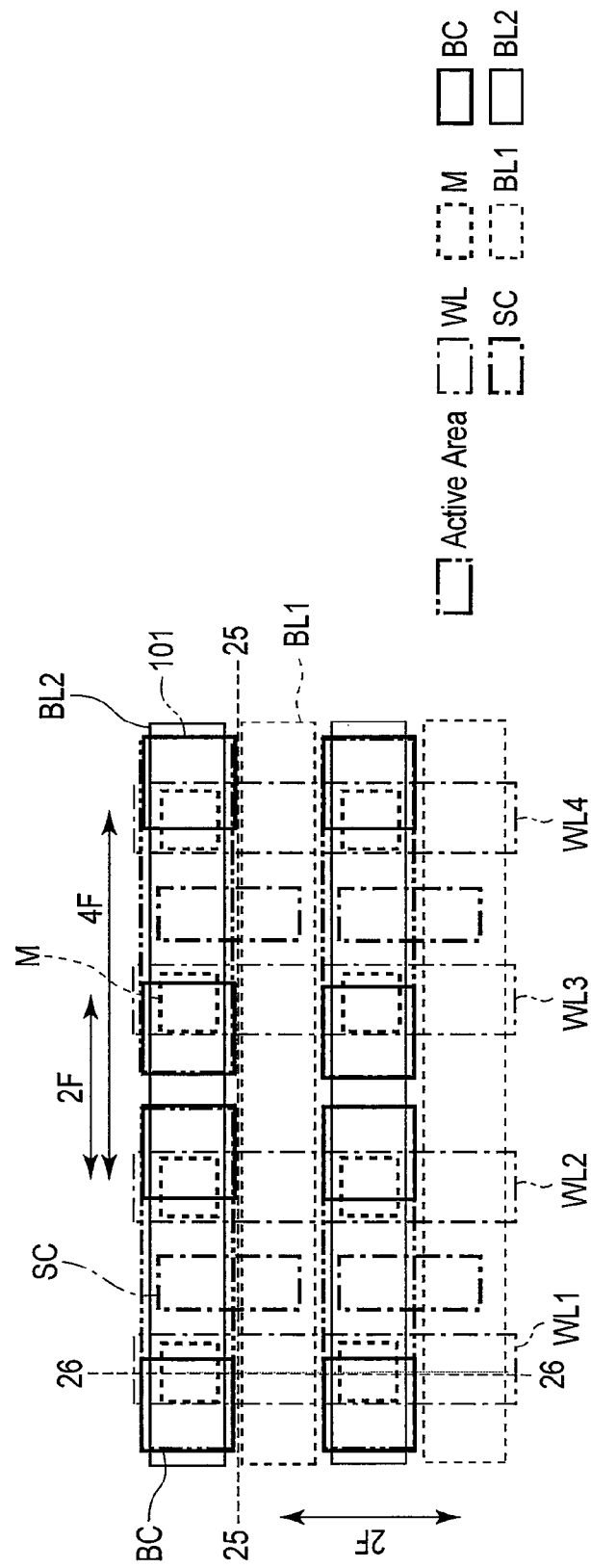
FIG. 24 is a plan view schematically illustrating a magnetoresistive memory according to a fifth embodiment.
Figure 26:
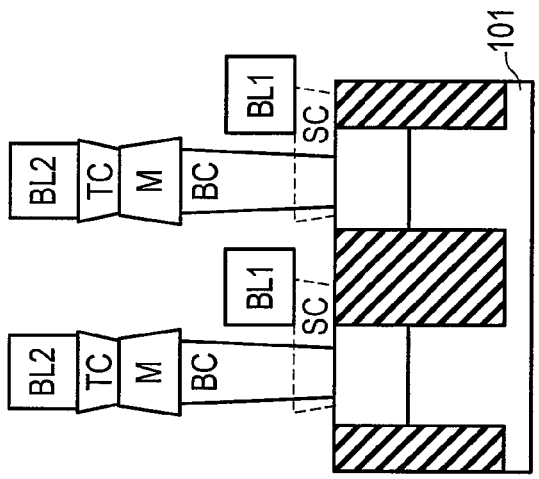
FIG. 26 is a cross-sectional view taken along line 26-26 in FIG. 24.
Figure 25:
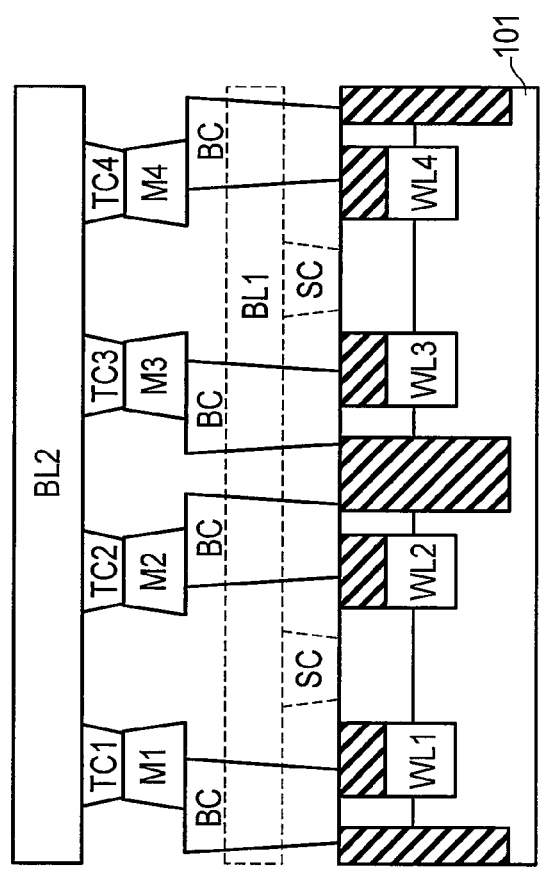
FIG. 25 is a cross-sectional view taken along line 25-25 in FIG. 24.

FIG. 24 is a plan view schematically illustrating a magnetoresistive memory according to a fifth embodiment. FIG. 25 is a cross-sectional view taken along line 25-25 in FIG. 24, and FIG. 26 is a cross-sectional view taken along line 26-26 in FIG. 24.

In the present embodiment, the plan-view pattern of the plug SC is rectangular. That is, the SC is disposed in a manner to cross a boundary between the AA and the STI. Thereby, the contact area between the plug SC and the source/drain region can be made larger. As a result, the parasitic resistance (contact resistance) between the plug SC and source/drain region can be reduced. Moreover, the position of the plug BC can be disposed at the center of the diffusion region, and the parasitic resistance between the plug BC and source/drain region can be reduced.

The plug SC of the present embodiment is obtained by applying the LELE illustrated in FIG. 20 to the layer of the plug SC. In this case, in the LELE illustrated in FIG. 20, the widths of the two-layer L&S patterns are adjusted in the Y direction, thereby the plan-view pattern of the plug SC can be made rectangular.

Sixth Embodiment

Figure 29:
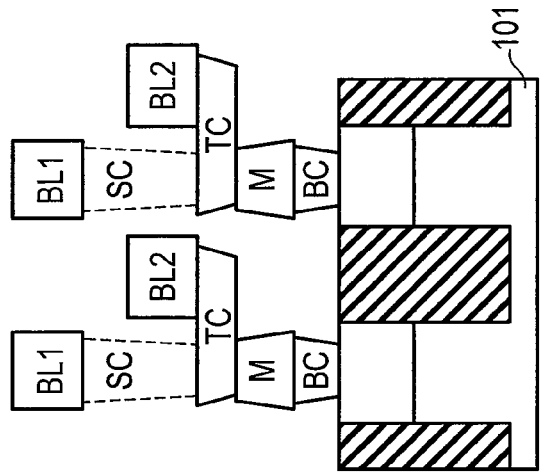
FIG. 29 is a cross-sectional view taken along line 29-29 in FIG. 27.
Figure 28:
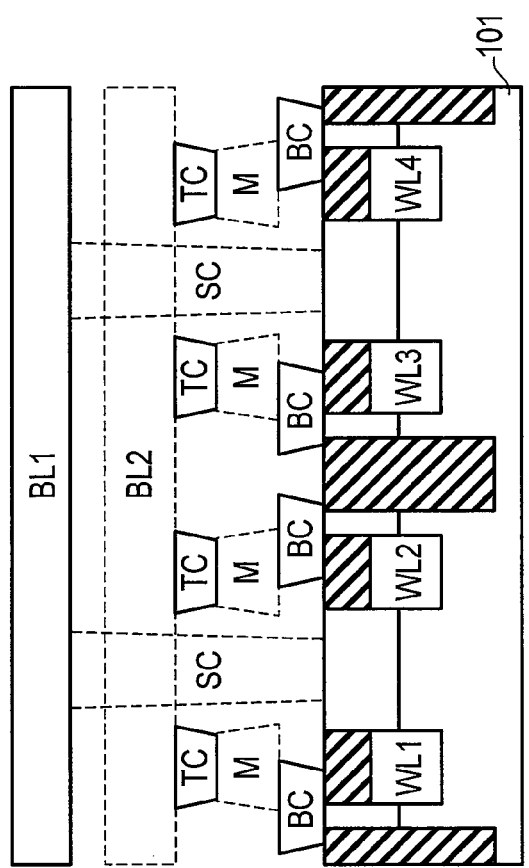
FIG. 28 is a cross-sectional view taken along line 28-28 in FIG. 27.

FIG. 27 is a plan view schematically illustrating a magnetoresistive memory according to a sixth embodiment. FIG. 28 is a cross-sectional view taken along line 28-28 in FIG. 27, and FIG. 29 is a cross-sectional view taken along line 29-29 in FIG. 27.

In the fifth embodiment, the plan-view pattern of the plug SC is made rectangular, but in the present embodiment, the plan-view pattern of the plug TC, in place of the plug SC, is made rectangular. That is, the TC is disposed in a manner to cross a boundary between the AA and the STI. The contact area between the plug TC and the bit line B12 can be made larger. Thereby, the parasitic resistance (contact resistance) between the plug TC and bit line B12 can be reduced. Moreover, the position of the plug BC can be disposed at the center of the diffusion region, and the parasitic resistance between the plug BC and source/drain region can be reduced.

The plan-view pattern of the MTJ element M, in place of the plug TC, may be made rectangular. At least one of the plan-view patterns of the plug SC, plug TC and MTJ element M may be made rectangular.

Seventh Embodiment

Figure 30:
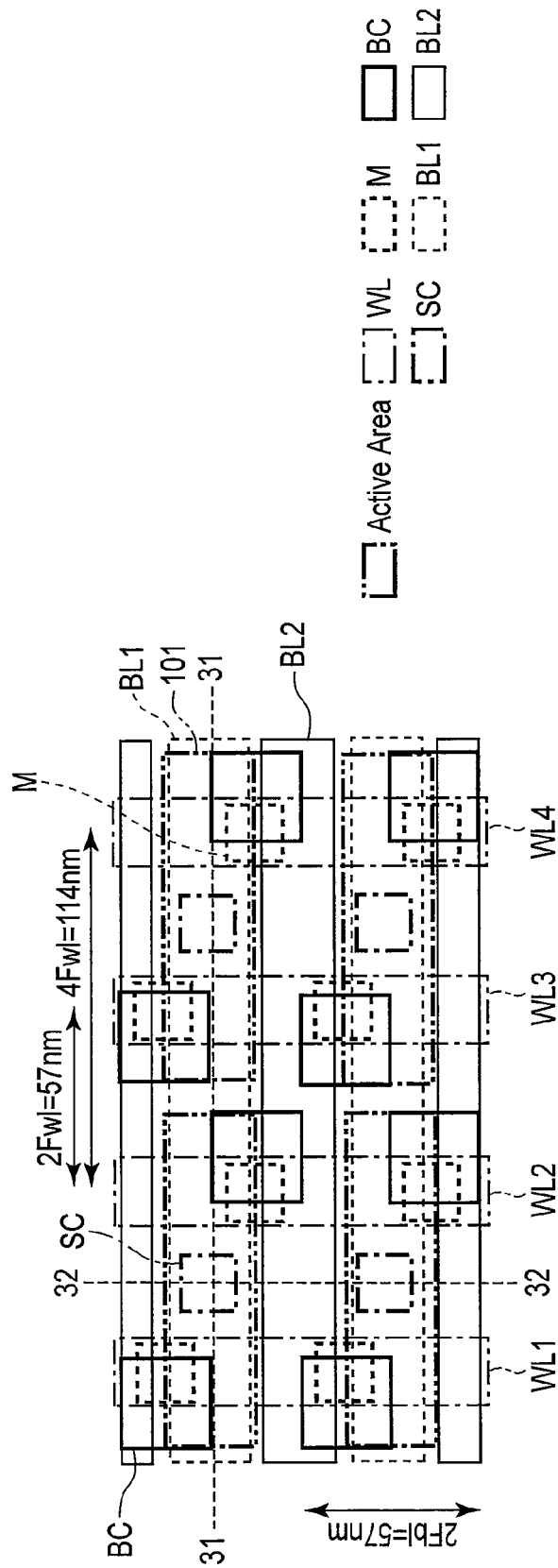
FIG. 30 is a plan view schematically illustrating a magnetoresistive memory according to a seventh embodiment.
Figure 31:
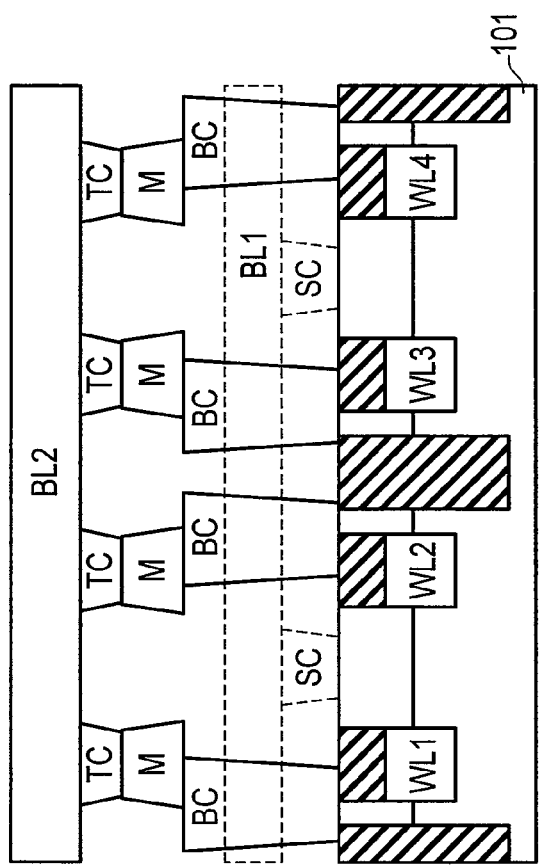
FIG. 31 is a cross-sectional view taken along line 31-31 in FIG. 30.
Figure 32:
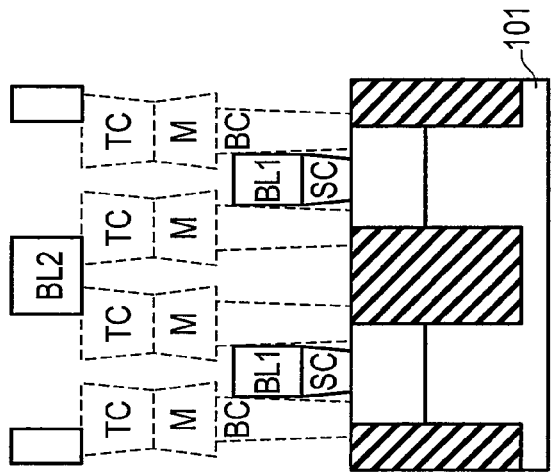
FIG. 32 is a cross-sectional view taken along line 32-32 in FIG. 30.

FIG. 30 is a plan view schematically illustrating a magnetoresistive memory according to a seventh embodiment. FIG. 31 is a cross-sectional view taken along line 31-31 in FIG. 30, and FIG. 32 is a cross-sectional view taken along line 32-32 in FIG. 30.

In the third embodiment, the L&S pattern of the resist pattern 204a is made to cross the L&S pattern of the resist pattern 204 at 90° ("perpendicular"), but in the present embodiment, these two L&S patterns are made to cross at an angle other than 90°. Thereby, contact holes, which are displaced on every other column (row), can be formed. As a result, since the distance between contact holes can be secured, a structure with a high tolerance to misalignment and/or poor breakdown voltage can be obtained.

Eighth Embodiment

Figure 35:
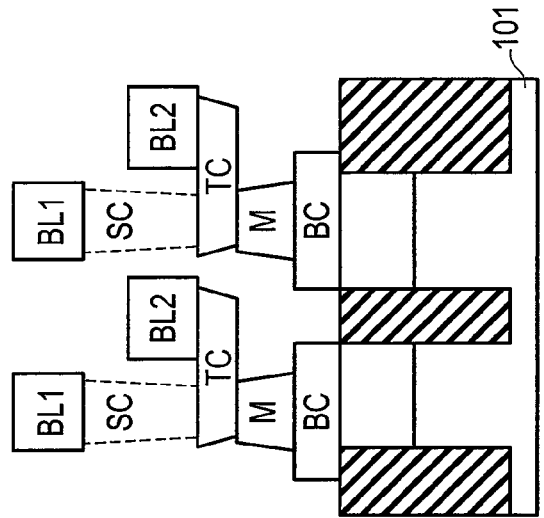
FIG. 35 is a cross-sectional view taken along line 35-35 in FIG. 33.
Figure 34:
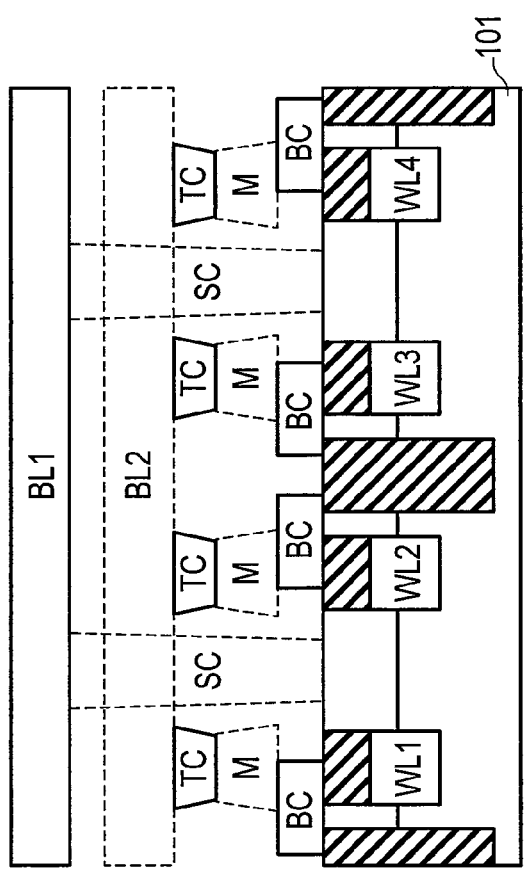
FIG. 34 is a cross-sectional view taken along line 34-34 in FIG. 33.

FIG. 33 is a plan view schematically illustrating a magnetoresistive memory according to an eighth embodiment. FIG. 34 is a cross-sectional view taken along line 34-34 in FIG. 33, and FIG. 35 is a cross-sectional view taken along line 35-35 in FIG. 33.

The plan-view pattern of the active area in the present embodiment is so chosen as to increase the area of the active area.

Figure 36:
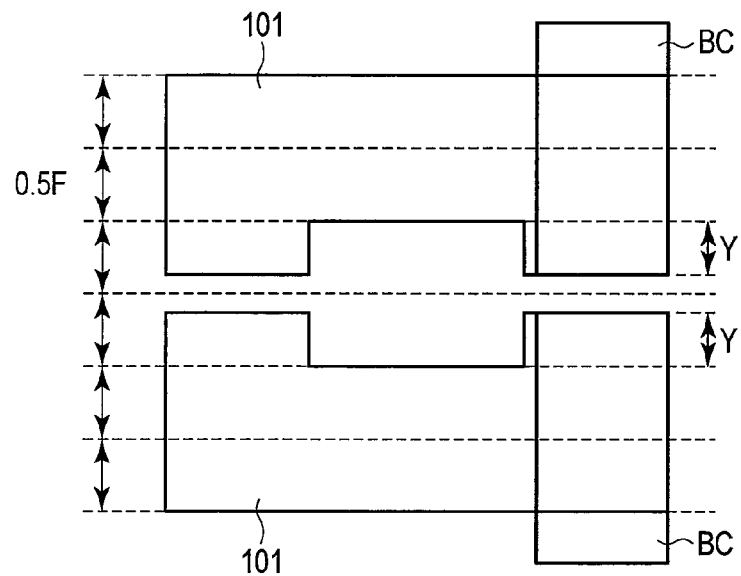
FIG. 36 is a plan view illustrating a plan-view pattern of active areas of the magnetoresistive memory according to the eighth embodiment.
Figure 37:
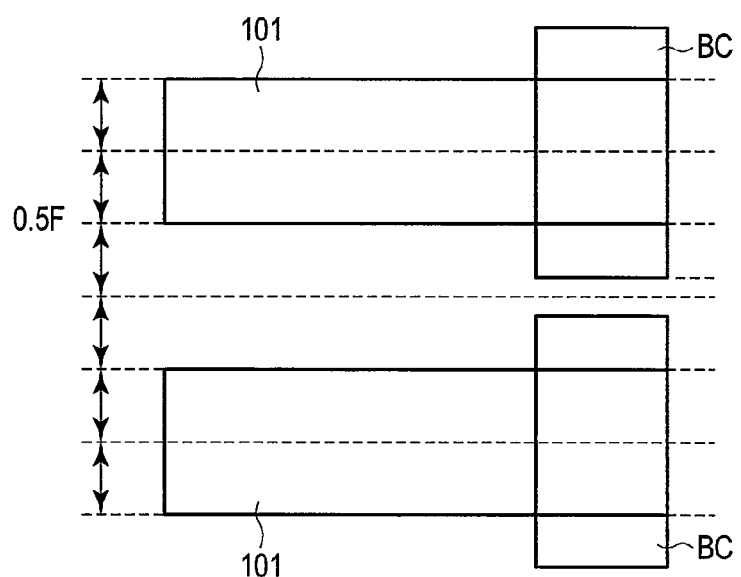
FIG. 37 is a plan view illustrating a plan-view pattern of active areas of a magnetoresistive memory of a comparative example.

FIG. 36 illustrates a plan-view pattern of active areas of the present embodiment, and FIG. 37 illustrates a plan-view pattern of active areas of a comparative example.

The plan-view pattern of the active area of the comparative example is rectangular (first rectangle). The plan-view pattern of the active area of the present embodiment has such a shape that rectangles (second rectangles) are added to both end portions of a long side of the plan-view pattern (first rectangle) of the comparative example. The plan-view pattern of the active area of the present embodiment is a concave pattern.

The area of the active area of the present embodiment is larger than that of the active area of the comparative example by a degree corresponding to the two second rectangles. Thereby, the contact area between the plug BC and source/drain region becomes larger by a degree corresponding to the second rectangles.

FIG. 38 to FIG. 41 are plan views for describing a method of forming active areas of the present embodiment. When trenches (word lines) are formed (FIG. 4), a pattern of a core material is a line, but in the case of forming active areas of the present embodiment, a pattern of a core material is a rectangle.

As illustrated in FIG. 38, a rectangular first layer 501 is formed on a silicon substrate (not shown).

Next, as shown in FIG. 39, the rectangular first layer 501 is slimmed. Thereafter, a second layer 502 is formed on a side wall of the rectangular first layer 501, and then the rectangular first layer 501 is removed (FIG. 40).

Next, a mask 503 for processing the second layer 502 by etching is formed (FIG. 41), thereafter, the second layer 502 is etched by using the mask 503 as a mask.

Next, the mask 503 is removed, thereafter, the silicon substrate (not shown) is etched by using the second layer 502 as a mask. As a result, trenches which define an isolation region are formed. Thereafter, a well-known process, such as burying an insulating film in the trench, is performed.

Ninth Embodiment

Figure 44:
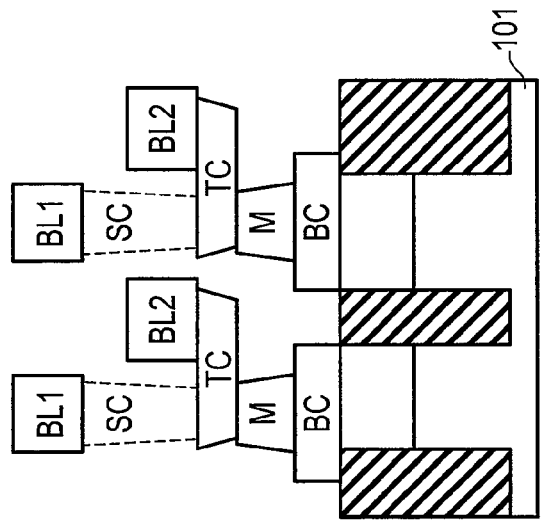
FIG. 44 is a cross-sectional view taken along line 44-44 in FIG. 42.
Figure 43:
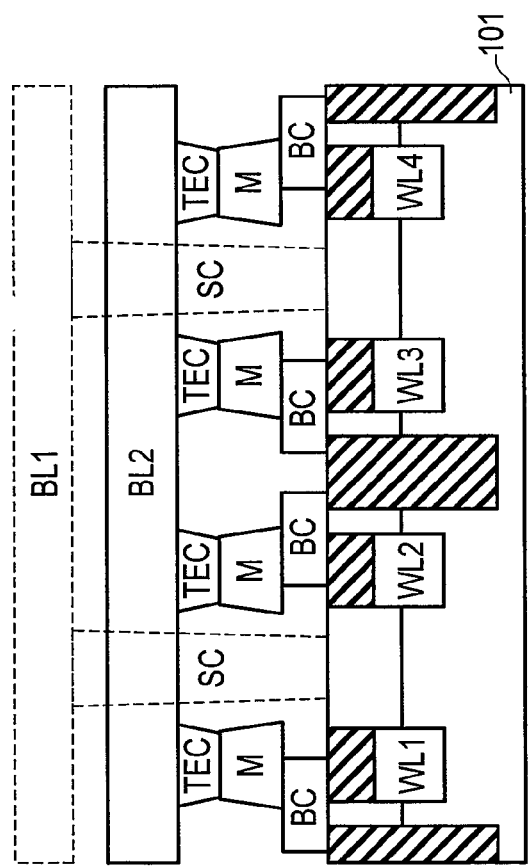
FIG. 43 is a cross-sectional view taken along line 43-43 in FIG. 42.

FIG. 42 is a plan view schematically illustrating a magnetoresistive memory according to a ninth embodiment. FIG. 43 is a cross-sectional view taken along line 43-43 in FIG. 42, and FIG. 44 is a cross-sectional view taken along line 44-44 in FIG. 42.

The present embodiment is an example of combination of the first embodiment, third embodiment and eighth embodiment. Therefore, according to the present embodiment, the parasitic capacitance between word lines can be reduced, and the parasitic resistance between the plug BC and source/drain region and the parasitic resistance between the plug SC and source/drain region can be reduced.

Tenth Embodiment

Figure 45:
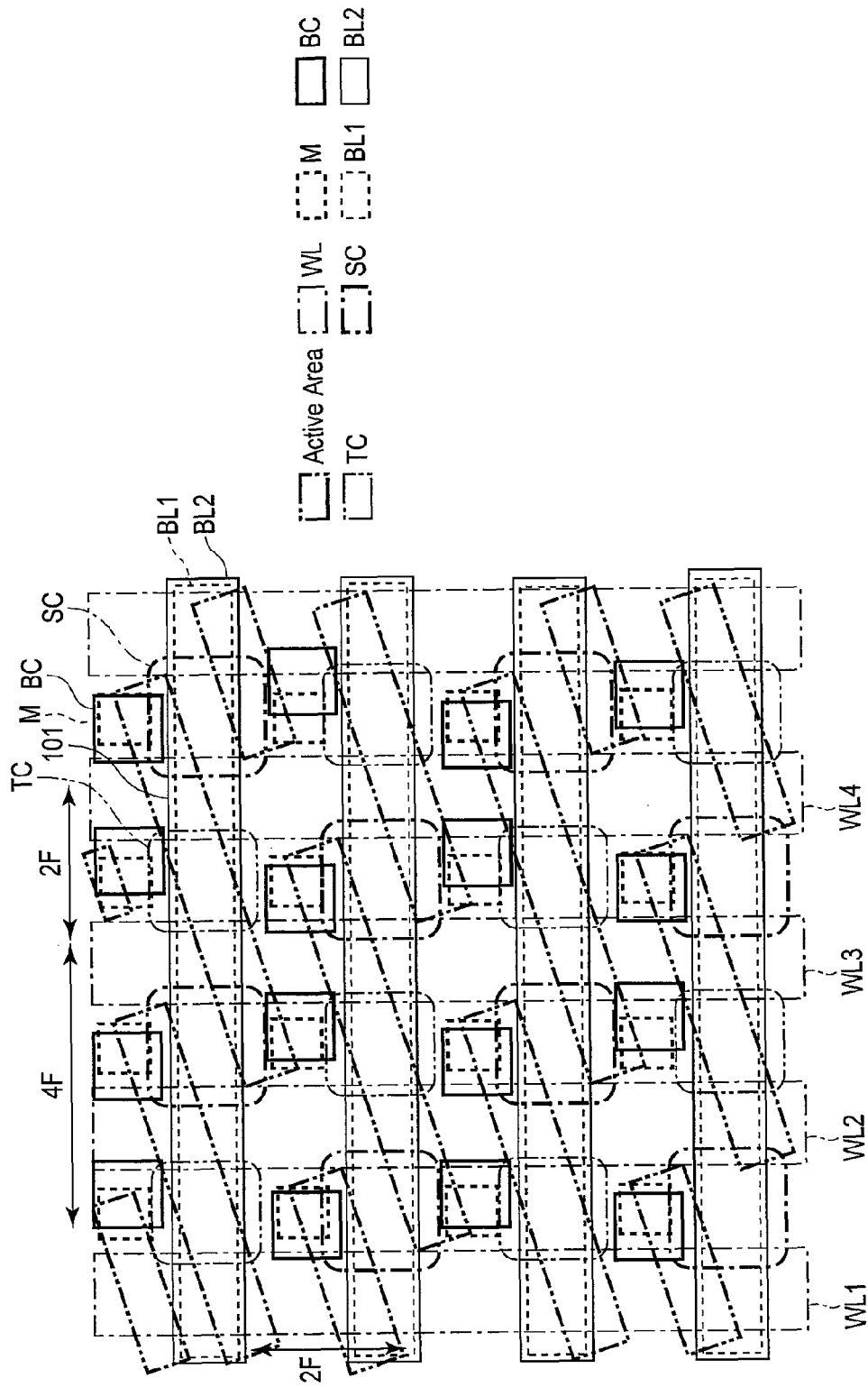
FIG. 45 is a plan view schematically illustrating a magnetoresistive memory according to a tenth embodiment.
Figure 46:
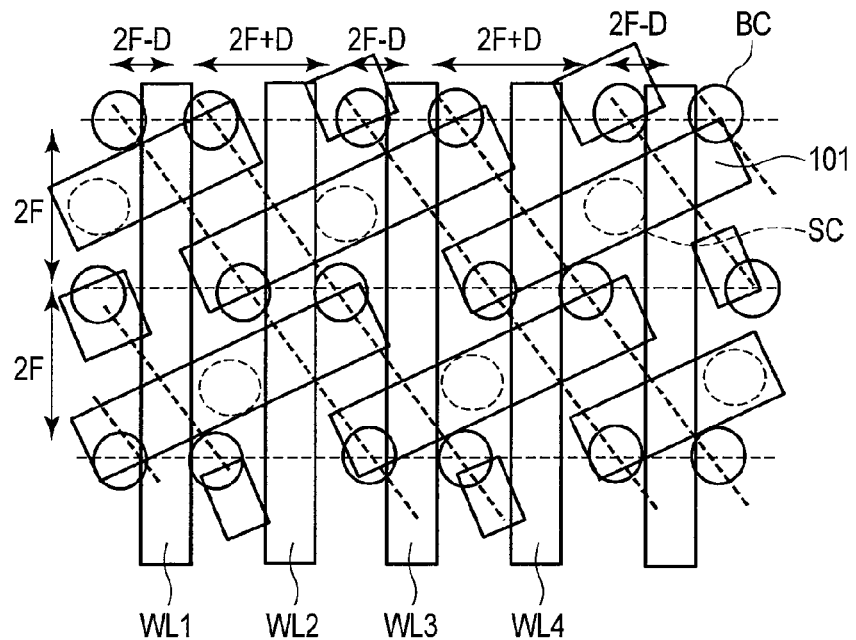
FIG. 46 is a plan view illustrating a layout of active areas and contract holes of the magnetoresistive memory according to the tenth embodiment.
Figure 47:
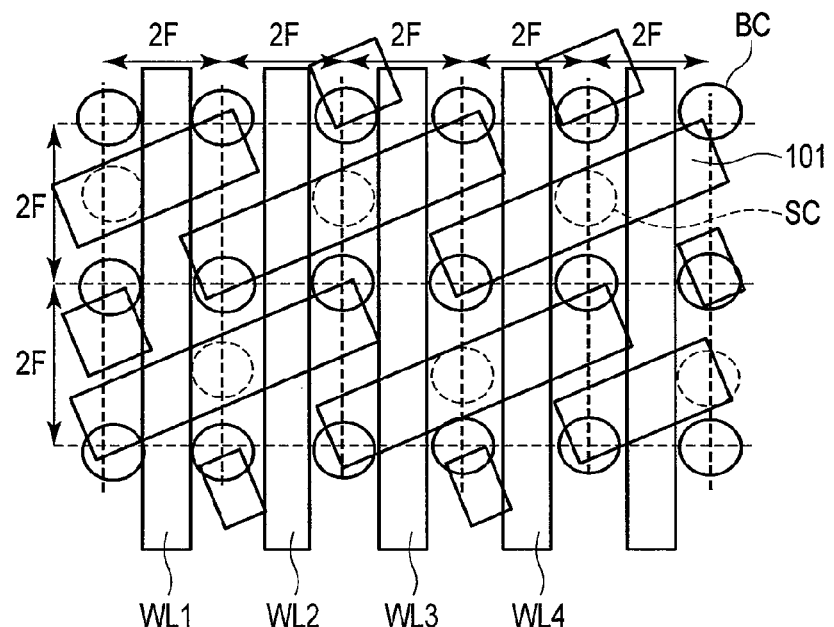
FIG. 47 is a plan view illustrating a layout of active areas and contract holes of a magnetoresistive memory of a comparative example.

FIG. 45 is a plan view schematically illustrating a magnetoresistive memory according to a tenth embodiment. FIG. 46 is a plan view illustrating a layout of active areas and contract holes of the magnetoresistive memory according to the present embodiment. FIG. 47 is a plan view illustrating a layout of active areas and contract holes of a magnetoresistive memory of a comparative example.

In the present embodiment, active areas 101 are obliquely disposed. That is, the active area 101 is not perpendicular to the WL, but crosses the WL at an angle less than 90°. The distance in the X direction (the direction perpendicular to the WL) between two plugs on each active area changes alternately between a distance (2F−D) which is less than the distance in the comparative example, and a distance (2F+D) which is greater than the distance in the comparative example. In a part where the distance between plugs BC in the X direction is larger, the WL extends in the Y direction, and the AA is discontinued and the STI exists a head of the AA. The two plugs BC on the active area in the present embodiment are shifted in the X direction so that the area of contact with the active source/drain region may increase. Thereby, the parasitic resistance (contact resistance) between the plug BC and the source/drain region can be reduced without increasing the area of the memory cell.

In the case of the present embodiment, as illustrated in FIG. 46, the plugs BC are arranged at regular intervals on a straight line in an oblique direction. The plugs BC are alternately provided on the active areas in the oblique direction. In the case of the comparative example, the plugs BC are arranged at regular intervals on a straight line in the vertical direction.

Figure 48:
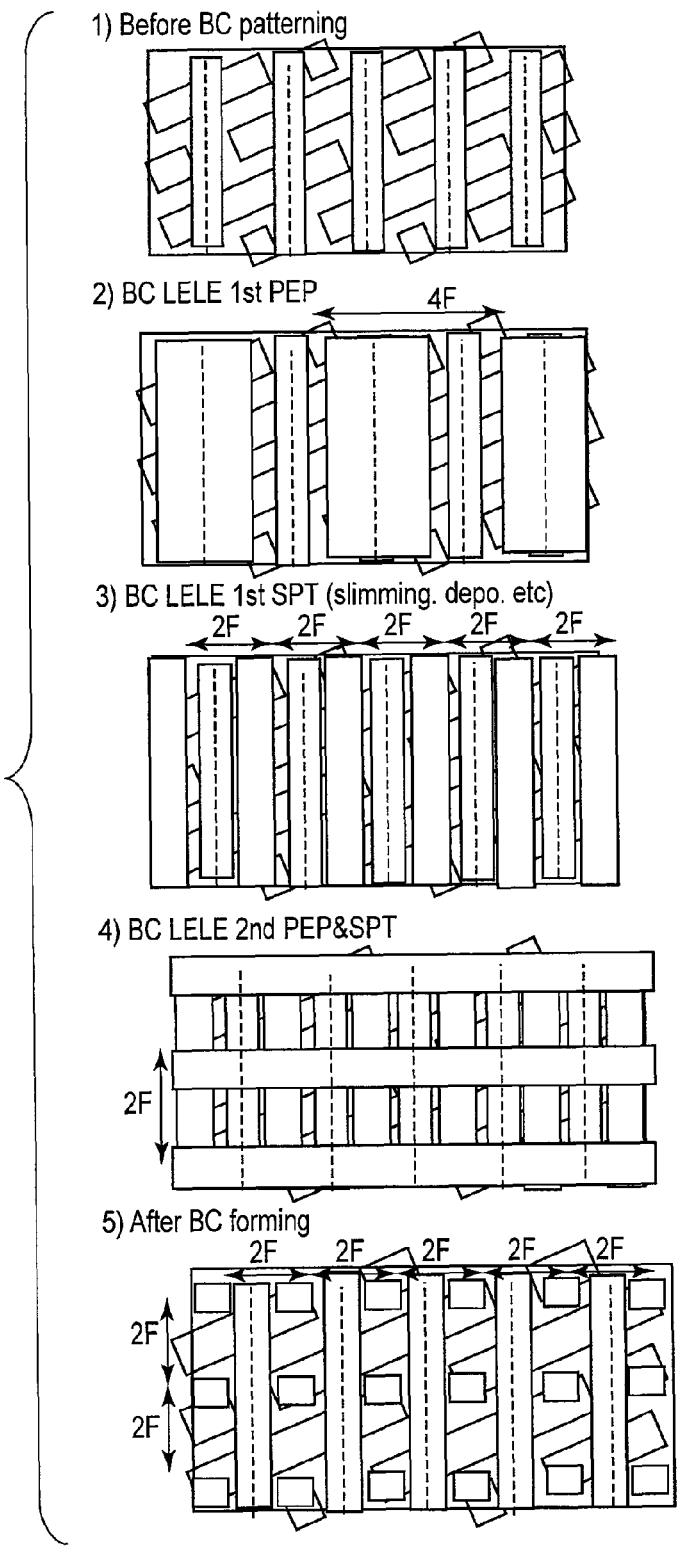
FIG. 48 is a plan view illustrating a method of forming contact holes of the magnetoresistive memory of the comparative example.
Figure 49:
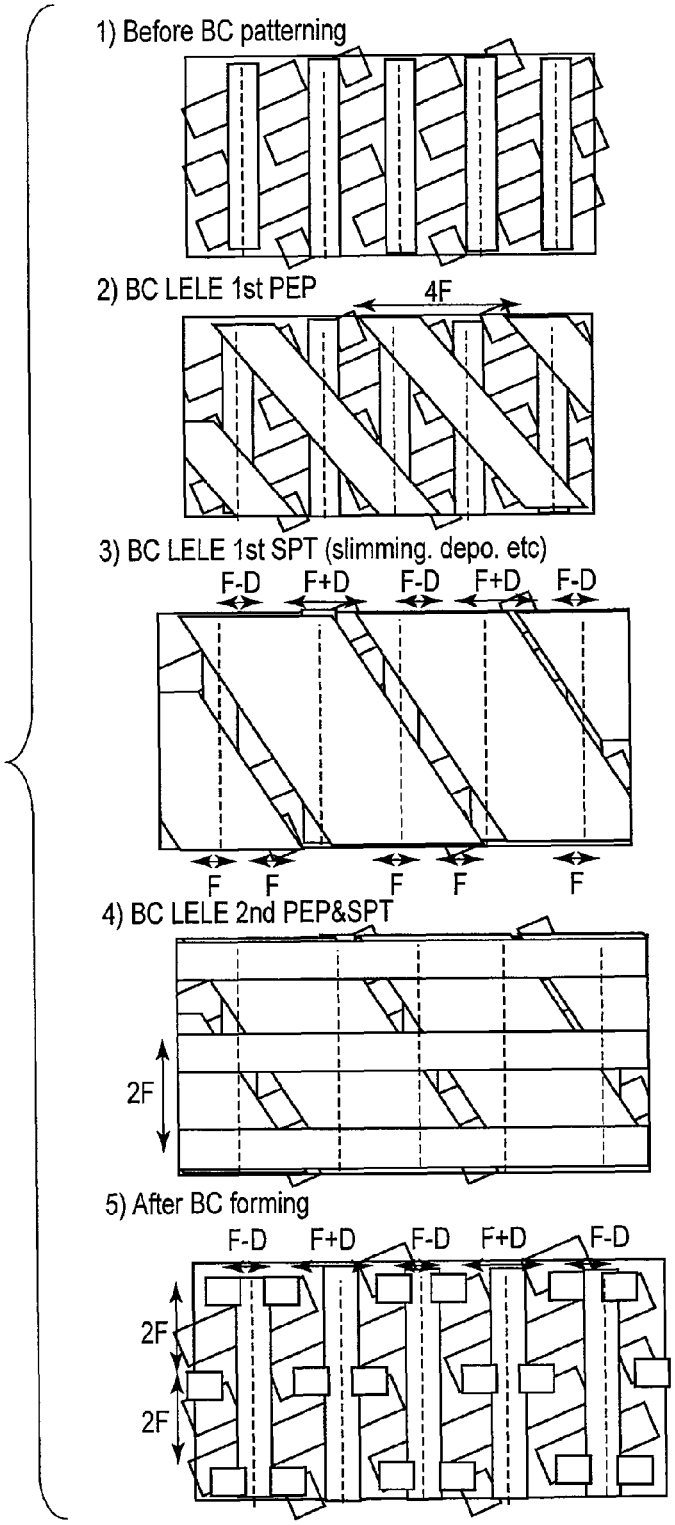
FIG. 49 is a plan view illustrating a method of forming contact holes of the magnetoresistive memory according to the tenth embodiment.

FIG. 48 is a plan view illustrating a method of forming contact holes in which the plugs BC of the comparative example are buried, and FIG. 49 is a plan view illustrating a method of forming contact holes in which the plugs BC of the present embodiment are buried. In the present embodiment, the contact pattern with pitches displaced on every other column can be formed, by applying the SPT method of the present embodiment which can adjust the pitch on every other column, to the first-layer L&S pattern that is obliquely disposed, when the cross-point process is performed by forming two-layer L&S patterns called LELE.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
a semiconductor substrate;
a plurality of active areas formed on a surface of the semiconductor substrate;
a plurality of word lines buried in the surface of the semiconductor substrate including the plurality of active areas, the plurality of word lines being parallel to a first direction;
a plurality of select transistors provided on the plurality of active areas, wherein at least two of the plurality of select transistors are provided for each of the plurality of active areas, and a plurality of gate electrodes of the plurality of select transistors are used for the plurality of word lines;
a plurality of variable resistance elements provided on the plurality of active areas, wherein at least two of the plurality of variable resistance elements are provided for each of the plurality of active areas, and the plurality of variable resistance elements are respectively connected to a plurality of drain regions of the plurality of select transistors; and
a plurality of lower plugs provided on the plurality of active areas, wherein at least two of the plurality of lower plugs are provided for each of the plurality of active areas, and the plurality of lower plugs are respectively provided between the plurality of drain regions of the plurality of select transistors and the plurality of variable resistance elements;
wherein the plurality of lower plugs comprise a first lower plug, and the plurality of variable resistance elements comprise a first variable resistance element provided on the first lower plug, and
a center of a top surface of the first lower plug is shifted from a center of a bottom surface of the first variable resistance element in a second direction, and the top surface of the first lower plug partially overlaps with the bottom surface of the first variable resistance element.

2. The memory according to claim 1, wherein the plurality of active areas are arranged in a direction perpendicular to the first direction, and include a first active area on which the first lower plug is provided.

3. The memory according to claim 2, wherein the plurality of lower plugs further comprise a second lower plug which is provided next to the first lower plug and provided on the first active area, and the plurality of variable resistance elements further comprise a second variable resistance element provided on the second lower plug, and
wherein a center of a top surface of the second lower plug is shifted from a center of a bottom surface of the second variable resistance element in a third direction different from the second direction, and the top surface of the second lower plug partially overlaps with the bottom surface of the second variable resistance element.

4. The memory according to claim 3, wherein the third direction is opposite to the second direction.

5. The memory according to claim 3, wherein the plurality of word lines comprise a first word line provided between the first variable resistance element and the second variable resistance element.

6. The memory according to claim 3, wherein the plurality of active areas further comprise a second active area which is provided next to the first active area, the plurality of lower plugs further comprise a third lower plug which is provided next to the second lower plug and provided on the second active area, and a distance between the first lower plug and the second lower plug is different from a distance between the second lower plug and the third lower plug.

7. The memory according to claim 6, wherein the plurality of variable resistance elements further comprise a third variable resistance element provided on the third lower plug, and
wherein a center of a top surface of the third lower plug is shifted from a center of a bottom surface of the third variable resistance element in the second direction, and the top surface of the third lower plug partially overlaps with the bottom surface of the third variable resistance element.

8. The memory according to claim 3, wherein the plurality of lower plugs further comprise a third lower plug which is provided next to the second lower plug and provided on the first active area, and
wherein a distance between the first lower plug and the second lower plug is different from a distance between the second lower plug and the third lower plug.

9. The memory according to claim 8, wherein the plurality of variable resistance elements further comprise a third variable resistance element provided on the third lower plug, and wherein a center of a top surface of the third lower plug is shifted from a center of a bottom surface of the third variable resistance element in the second direction, and the top surface of the third lower plug partially overlaps with the bottom surface of the third variable resistance element.

10. The memory according to claim 1, wherein the plurality of active areas comprise a first plurality of active areas arranged in a fourth direction, the fourth direction being neither parallel nor perpendicular to the first direction, and the first plurality of active areas including a first active area on which the first lower plug is provided.

11. The memory according to claim 10, wherein the plurality of active areas further comprise a second plurality of active areas arranged in the fourth direction and apart from the first plurality of active areas in a fifth direction, the fifth direction being perpendicular to the fourth direction, wherein the second plurality of active areas comprises a second active area provided next to the first active area in the fifth direction, a center of the second active area being shifted from a center of the first active area in the fourth direction, wherein the plurality of lower plugs further comprise a second lower plug which is provided next to the first lower plug and provided on the second active area, and the plurality of variable resistance elements further comprise a second variable resistance element provided on the second lower plug, and wherein a center of a top surface of the second lower plug is shifted from a center of a bottom surface of the second variable resistance element in a third direction, the third direction being different from the second direction, and the top surface of the second lower plug partially overlaps with the bottom surface of the second variable resistance element.

12. The memory according to claim 11, wherein the third direction is opposite to the second direction.

13. The memory according to claim 11, wherein the plurality of word lines comprise a first word line provided between the first variable resistance element and the second variable resistance element.

14. The memory according to claim 11, wherein the second plurality of active areas further comprises a third active area which is provided next to the first active area in the fifth direction and next to the second active area in the fourth direction, and wherein the plurality of lower plugs further comprise a third lower plug which is provided next to the second lower plug and provided on the third active area, and a distance between the first lower plug and the second lower plug is different from a distance between the second lower plug and the third lower plug.

15. The memory according to claim 14, wherein the plurality of variable resistance elements further comprise a third variable resistance element provided on the third lower plug, and wherein a center of a top surface of the third lower plug is shifted from a center of a bottom surface of the third variable resistance element in the second direction, and the top surface of the third lower plug partially overlaps with the bottom surface of the third variable resistance element.

16. The memory according to claim 1, wherein the first variable resistance element comprises a MTJ (Magnetic Tunnel Junction) element.

17. The memory according to claim 16, wherein the MTJ element comprises a storage layer, a reference layer, and a nonmagnetic layer therebetween.

* * * * *